US012699494B2

(12) United States Patent　　　(10) Patent No.:　US 12,699,494 B2

Kim et al.　　　(45) Date of Patent:　**\*Aug. 4, 2026**

(54) DISPLAY DEVICE INCLUDING SENSING PATTERNS WITH DIFFERENT LINE WIDTHS AND MESH OPENING SHAPES, AND ELECTRONIC DEVICE INCLUDING THE SAME

(71) Applicant: SAMSUNG DISPLAY CO., LTD., Yongin-si (KR)

(72) Inventors: Kicheol Kim, Yongin-si (KR); Minjoo Kim, Seongnam-si (KR); Chiwook An, Hwaseong-si (KR); Hyeonbum Lee, Hwaseong-si (KR)

(73) Assignee: SAMSUNG DISPLAY CO., LTD., Yongin-si (KR)

( \* ) Notice: Subject to any disclaimer, the term of this patent is extended or adjusted under 35 U.S.C. 154(b) by 0 days.

This patent is subject to a terminal disclaimer.

(21) Appl. No.: 18/820,984

(22) Filed: Aug. 30, 2024

(65) Prior Publication Data

US 2024/0419289 A1　　Dec. 19, 2024

Related U.S. Application Data

(63) Continuation of application No. 17/930,508, filed on Sep. 8, 2022, now Pat. No. 12,105,924.

(30) Foreign Application Priority Data

Dec. 15, 2021　(KR) ........................ 10-2021-0179793

(51) Int. Cl.
　*G06F 3/044*　　　(2006.01)
　*G09G 3/3233*　　(2016.01)
　*H10K 59/121*　　(2023.01)
　*H10K 59/38*　　　(2023.01)
　*H10K 59/40*　　　(2023.01)
　*H10K 59/65*　　　(2023.01)
　*H10K 59/80*　　　(2023.01)

(52) U.S. Cl.
　CPC ......... *G06F 3/0448* (2019.05); *G09G 3/3233* (2013.01); *H10K 59/121* (2023.02);
　　　(Continued)

(58) Field of Classification Search
　CPC ................. G06F 3/0448; G06F 3/0443; G06F 2203/04111; H10K 59/40; H10K 59/65;
　　　(Continued)

(56) References Cited

U.S. PATENT DOCUMENTS 8,624,849 B2　1/2014　Chang et al.
10,739,929 B2　8/2020　Lee et al.
　　　(Continued)

FOREIGN PATENT DOCUMENTS

CN　　107831937　　3/2018
KR　　10-1356336　　1/2014
　　　(Continued)

*Primary Examiner* — Nathan P Brittingham

(74) *Attorney, Agent, or Firm* — F. CHAU & ASSOCIATES, LLC

(57)　　　　ABSTRACT

In a display device according to the present disclosure, the display device includes a display panel and an input sensor layer. The display panel includes a display area that includes a first area through which an optical signal passes and a second area by which the optical signal is blocked. The first area includes a first sub-area having a first light transmittance and a second sub-area having a second light transmittance lower than the first light transmittance. The input sensor layer includes a first sensing pattern that overlaps the second area and includes first openings, and a second sensing pattern that overlaps the first area. The second sensing pattern includes second openings that overlap the second sub-area and are larger than the first openings, and at least one third opening that overlaps the first sub-area and is larger than the second openings.

23 Claims, 23 Drawing Sheets

(52) U.S. Cl.
CPC ............. *H10K 59/38* (2023.02); *H10K 59/40* (2023.02); *H10K 59/65* (2023.02); *H10K 59/8791* (2023.02); *G06F 3/0443* (2019.05); *G06F 2203/04111* (2013.01); *G09G 2300/0426* (2013.01); *G09G 2300/0809* (2013.01); *G09G 2354/00* (2013.01)

(58) Field of Classification Search
CPC ...... H10K 59/38; H10K 50/86; H10K 59/121; G09G 3/3233; G09G 2300/0426; G09G 2300/0809; G09G 2354/00
See application file for complete search history.

(56) References Cited

U.S. PATENT DOCUMENTS

| | | | |
|---|---|---|---|
| 11,287,938 B2 | 3/2022 | Lee et al. | |
| 11,355,727 B2 | 6/2022 | Yee | |
| 11,626,467 B2 | 4/2023 | Lee et al. | |
| 11,694,468 B2 | 7/2023 | Yoo et al. | |
| 2019/0034010 A1* | 1/2019 | Lee | G06F 3/0443 |
| 2019/0237533 A1* | 8/2019 | Kim | G09G 3/3275 |
| 2020/0335023 A1 | 10/2020 | Yen | |
| 2021/0358379 A1 | 11/2021 | Li et al. | |
| 2022/0052242 A1* | 2/2022 | Ikeda | H10H 20/831 |
| 2022/0069047 A1* | 3/2022 | Yang | H10K 59/131 |
| 2022/0100321 A1* | 3/2022 | Choi | G06F 3/0446 |
| 2022/0208869 A1* | 6/2022 | Jeong | H10K 59/124 |
| 2022/0221763 A1* | 7/2022 | Kimura | G02F 1/13439 |
| 2023/0185418 A1 | 6/2023 | Kim et al. | |
| 2023/0350530 A1* | 11/2023 | Choi | G06F 3/0443 |

FOREIGN PATENT DOCUMENTS

| | | |
|---|---|---|
| KR | 10-2019-0014266 | 2/2019 |
| KR | 10-2020-0078687 | 7/2020 |
| KR | 10-2021-0003990 A | 1/2021 |
| KR | 10-2021-0065244 A | 6/2021 |
| KR | 10-2021-0119007 A | 10/2021 |
| KR | 10-2021-0126838 A | 10/2021 |

* cited by examiner

DISPLAY DEVICE INCLUDING SENSING PATTERNS WITH DIFFERENT LINE WIDTHS AND MESH OPENING SHAPES, AND ELECTRONIC DEVICE INCLUDING THE SAME

CROSS-REFERENCE TO RELATED APPLICATIONS

This application is a continuation application of U.S. patent application Ser. No. 17/930,508, filed on Sep. 8, 2022, which claims priority under 35 U.S.C. § 119 to Korean Patent Application No. 10-2021-0179793, filed on Dec. 15, 2021 in the Korean Intellectual Property Office, the disclosures of which are incorporated by reference herein in their entireties.

TECHNICAL FIELD

Embodiments of the present disclosure relate to a display device and an electronic device including the same, and more particularly, to a display device including a display area through which an optical signal passes and an electronic device including the display device.

DISCUSSION OF RELATED ART

A display device may include various electronic parts such as a display module that displays an image and an electro-optical module. The electronic parts may be electrically connected together by signal lines arranged in various ways. The electro-optical module may include a camera, an infrared sensor, a proximity sensor, etc.

The electro-optical module may be disposed under the display module. The display module may include an active area where an image is displayed and a peripheral area adjacent to the active area. The electro-optical module may be disposed under the peripheral area.

SUMMARY

Embodiments of the present disclosure provide a display device having increased transmittance in a sensing area.

Embodiments of the present disclosure provide an electronic device including the display device.

According to an embodiment, a display device includes a display panel and an input sensor layer disposed over the display panel. The display panel includes a display area and a peripheral area adjacent to the display area, and the display area includes a first area through which an optical signal passes and a second area adjacent to the first area and by which the optical signal is blocked. The first area includes a first sub-area having a first light transmittance and a second sub-area having a second light transmittance lower than the first light transmittance.

The input sensor layer includes a first sensing pattern that overlaps the second area and includes a plurality of first openings, and a second sensing pattern that overlaps the first area. The second sensing pattern includes a plurality of second openings that overlap the second sub-area, each of which being larger than each of the plurality of first openings, and at least one third opening that overlaps the first sub-area and is larger than each of the plurality of second openings.

According to an embodiment, an electronic device includes a display panel, an input sensor layer disposed over the display panel, and an electro-optical module disposed under the display panel.

The display panel includes a display area and a peripheral area adjacent to the display area, and the display area includes a first area through which an optical signal passes and a second area adjacent to the first area and by which the optical signal is blocked. The electro-optical module receives the optical signal passing through the first area. The first area includes a first sub-area having a first light transmittance and a second sub-area having a second light transmittance lower than the first light transmittance.

The input sensor layer includes a first sensing pattern that overlaps the second area and includes a plurality of first openings, and a second sensing pattern that overlaps the first area. The second sensing pattern includes a plurality of second openings that overlap the second sub-area, each of which being larger than each of the plurality of first openings, and at least one third opening that overlaps the first sub-area and is larger than each of the plurality of second openings.

BRIEF DESCRIPTION OF THE DRAWINGS

The above and other objects and features of the present disclosure will become apparent by describing in detail embodiments thereof with reference to the accompanying drawings.

DETAILED DESCRIPTION

Figure 1:
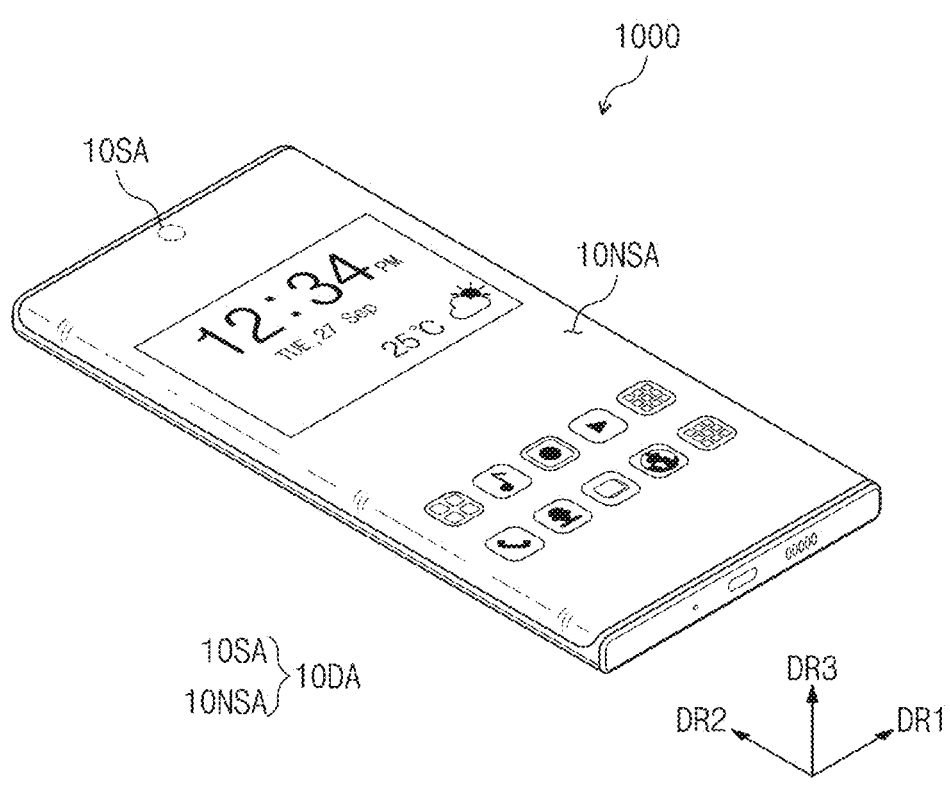
FIG. 1 is a perspective view of an electronic device according to an embodiment of the present disclosure.

Embodiments of the present disclosure will be described more fully hereinafter with reference to the accompanying drawings. Like reference numerals may refer to like elements throughout the accompanying drawings.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

As used herein, the term "and/or" includes all of one or more combinations defined by related components.

Terms such as first, second, etc. may be used to describe various components, but the components should not be limited by the terms. The terms may be used only for distinguishing one component from other components. For example, without departing the scope of the present disclosure, a first component may be referred to as a second component, and similarly, the second component may also be referred to as the first component. The terms of a singular form may include plural forms unless otherwise specified.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

FIG. 1 is a perspective view of an electronic device 1000 according to an embodiment of the present disclosure.

Referring to FIG. 1, the electronic device 1000 may include a display device. The electronic device 1000 may be a device that is activated in response to an electrical signal. For example, the electronic device 1000 may be a mobile phone, a tablet computer, a monitor, a television, a car navigation system, a game machine, or a wearable device. Although FIG. 1 illustrates an example in which the electronic device 1000 is a mobile phone, embodiments of the present disclosure are not limited thereto.

The electronic device 1000 may display an image through a display area 10DA. The display area 10DA may include a flat surface defined by a first direction DR1 and a second direction DR2. The display area 10DA may further include curved surfaces bent from at least two sides of the flat surface. However, the shape of the display area 10DA is not limited thereto. For example, the display area 10DA may include only the flat surface, or may further include four curved surfaces bent from at least two sides, for example, four sides of the flat surface, according to embodiments.

A first area of the display area 10DA may be defined as a sensing area 10SA. Although only one sensing area 10SA is illustrated in FIG. 1, the number of sensing areas 10SA is not limited thereto. The sensing area 10SA may be a portion of the display area 10DA and may have a higher light transmittance than a second area of the display area 10DA. A second area of the display area 10DA may be referred to as a non-sensing area 10NSA. The sensing area 10SA may have a higher light transmittance than the non-sensing area 10NSA. Accordingly, the electronic device 1000 may display an image through the sensing area SA and may receive or transmit an optical signal through the sensing area 10SA.

The electronic device 1000 may include an electro-optical module disposed in an area overlapping the sensing area 10SA. The electro-optical module may receive an optical signal provided from outside the electronic device 1000 through the sensing area 10SA, or may output an optical signal through the sensing area 10SA. For example, the electro-optical module may be a camera module, a sensor (e.g., a proximity sensor) that measures the distance between an object and a mobile phone, a sensor that recognizes a part of a user's body (e.g., a fingerprint, an iris, or a face), or a small lamp that outputs light, but is not particularly limited thereto.

The thickness direction of the electronic device 1000 may be a third direction DR3 that is the normal direction of the display area 10DA. Front surfaces (or upper surfaces) and rear surfaces (or lower surfaces) of members constituting the electronic device 1000 may be defined based on the third direction DR3.

Figure 2:
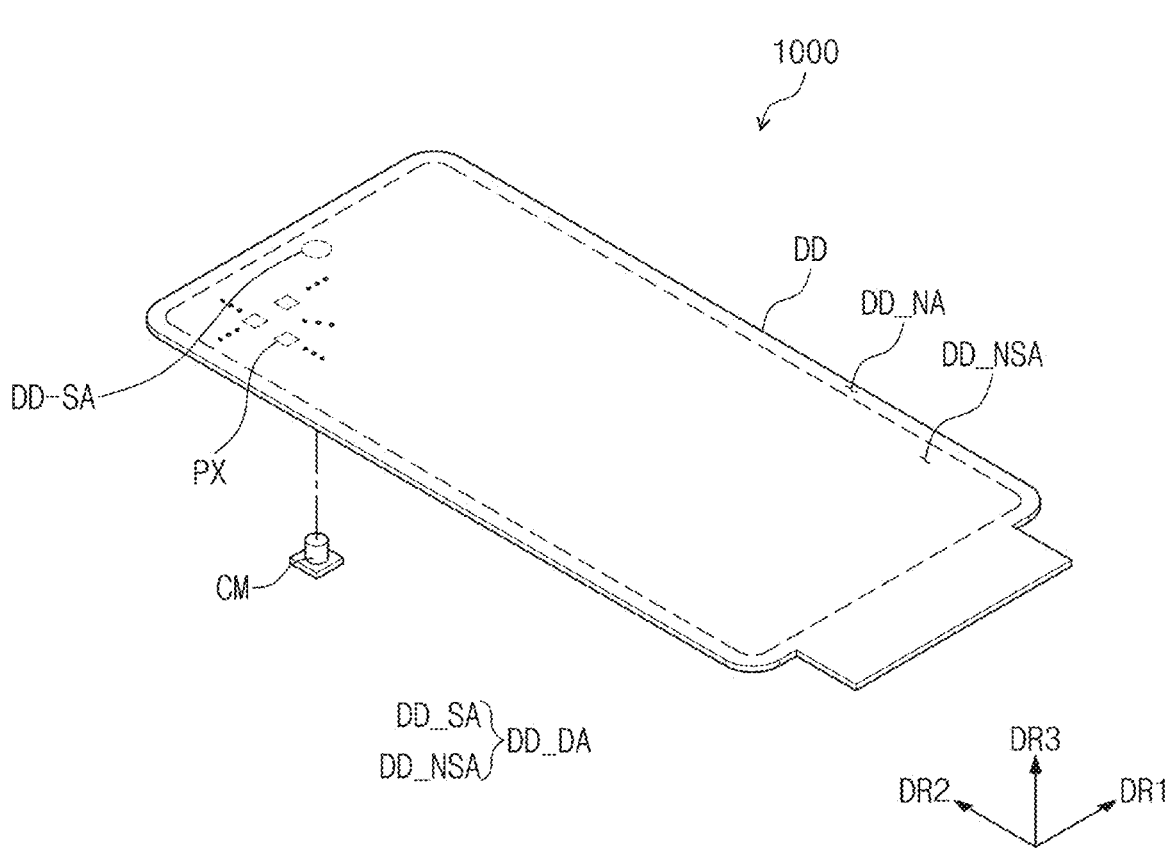
FIG. 2 is an exploded perspective view illustrating some components of the electronic device according to an embodiment of the present disclosure.

FIG. 2 is an exploded perspective view illustrating some components of the electronic device 1000 according to an embodiment of the present disclosure.

Referring to FIG. 2, the electronic device 1000 may include a display device DD and a camera module CM. The display device DD may generate an image and may sense an external input. The camera module CM is disposed under the display device DD. The display device DD may be referred to as the first electronic module constituting the electronic device 1000, and the camera module CM may be referred to as the second electronic module or the electro-optical module.

The display device DD may include a display area DD_DA and a peripheral area DD_NA. The display area DD_DA may correspond to the display area 10DA illustrated in FIG. 1. The display area DD_DA may include a first area DD_SA and a second area DD_NSA. The first area DD_SA of the display area DD_DA may be defined as a sensing area, and the sensing area DD_SA may have a higher transmittance than the second area DD_NSA (hereinafter referred to as a non-sensing area or a normal area) of the display area DD_DA. Accordingly, the sensing area DD_SA may provide external natural light to the camera module CM. As the sensing area DD_SA is a portion of the display area DD_DA, the sensing area DD_SA may display an image.

Pixels PX are disposed in the display area DD_DA. Light emitting elements are disposed in the display area DD_DA and are not disposed in the peripheral area DD_NA. The pixels PX are disposed in the sensing area DD_SA and the normal area DD_NSA. However, configurations of the pixels PX disposed in the sensing area DD_SA and the normal area DD_NSA may differ from each other. A detailed description thereof is provided below.

Figure 3:
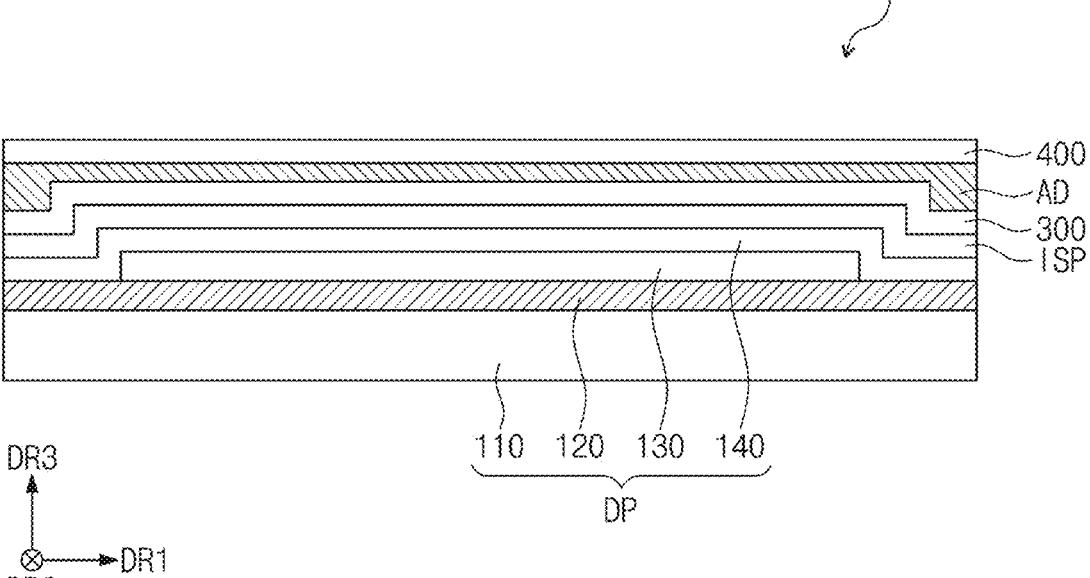
FIG. 3 is a cross-sectional view of a display device according to an embodiment of the present disclosure.

FIG. 3 is a cross-sectional view of the display device DD according to an embodiment of the present disclosure.

Referring to FIG. 3, the display device DD may include a display panel DP, an input sensor layer ISP, an anti-reflection layer 300, and a window 400. The anti-reflection layer 300 and the window 400 may be coupled to each other by an adhesive layer AD.

The display panel DP may be a component that substantially generates an image. The display panel DP may be an emissive display panel. For example, the display panel DP may be an organic light emitting display panel, an inorganic light emitting display panel, a micro-LED display panel, or a nano-LED display panel. The display panel DP may be referred to as the display layer.

The display panel DP may include a base layer 110, a circuit layer 120, a light emitting element layer 130, and an encapsulation layer 140.

The base layer 110 may be a member that provides a base surface on which the circuit layer 120 is disposed. The base layer 110 may be a rigid substrate, or a flexible substrate that can be bent, folded, or rolled. The base layer 110 may be, for example, a glass substrate, a metal substrate, or a polymer substrate. However, embodiments of the present disclosure are not limited thereto, and the base layer 110 may be, for example, an inorganic layer, an organic layer, or a composite layer.

The base layer 110 may have a multi-layer structure. For example, the base layer 110 may include a first synthetic resin layer, an inorganic layer having a multi-layer structure or a single-layer structure, and a second synthetic resin layer disposed on the inorganic layer having the multi-layer structure or the single-layer structure. Each of the first and second synthetic resin layers may include a polyimide-based resin, but is not particularly limited.

The circuit layer 120 may be disposed on the base layer 110. The circuit layer 120 may include, for example, an insulating layer, a semiconductor pattern, a conductive pattern, and a signal line.

The light emitting element layer 130 may be disposed on the circuit layer 120. The light emitting element layer 130 may include a light emitting element. For example, the light emitting element may include an organic light emitting material, an inorganic light emitting material, an organic-inorganic light emitting material, a quantum dot, a quantum rod, a micro LED, or a nano-LED.

The encapsulation layer 140 may be disposed on the light emitting element layer 130. The encapsulation layer 140 may protect the light emitting element layer 130 from foreign matter such as, for example, moisture, oxygen, and dust particles. The encapsulation layer 140 may include at least one inorganic layer. The encapsulation layer 140 may include a structure in which an inorganic layer, an organic layer, and an inorganic layer are stacked one above another.

The input sensor layer ISP may be disposed on the display panel DP. The input sensor layer ISP may sense an external input applied from outside the electronic device 1000. The external input may be a user input. The user input may include various types of external inputs such as, for example, a part of the user's body, light, heat, a pen, or pressure.

The input sensor layer ISP may be formed on the display panel DP through a continuous process. In this case, the input sensor layer ISP may be directly disposed on the display panel DP. When the input sensor layer ISP is directly disposed on the display panel DP, this means that a third component is not disposed between the input sensor layer ISP and the display panel DP. That is, a separate adhesive member is not disposed between the input sensor layer ISP and the display panel DP when the input sensor layer ISP is directly disposed on the display panel DP.

The anti-reflection layer 300 may be directly disposed on the input sensor layer ISP. The anti-reflection layer 300 may decrease the reflectivity of external light incident from outside the display device DD. The anti-reflection layer 300 may be formed on the input sensor layer ISP through a continuous process. The anti-reflection layer 300 may include color filters. The color filters may have a predetermined arrangement. For example, the color filters may be arranged in consideration of light emission colors of pixels included in the display panel DP. Furthermore, the anti-reflection layer 300 may further include a black matrix adjacent to the color filters. A further description of the anti-reflection layer 300 is provided below.

In an embodiment of the present disclosure, the positions of the input sensor layer ISP and the anti-reflection layer 300 may be interchanged with each other.

In an embodiment of the present disclosure, the display device DD may further include an optical layer disposed on the anti-reflection layer 300. For example, the optical layer may be formed on the anti-reflection layer 300 through a continuous process. The optical layer may control the direction of light incident from the display panel DP to increase the front luminance of the display device DD. For example, the optical layer may include an organic insulating layer having openings defined therein to correspond to emissive areas of the pixels included in the display panel DP and a highly refractive layer that covers the organic insulating layer and fills the openings. The highly refractive layer may have a higher refractive index than the organic insulating layer.

The window 400 may provide the front surface of the electronic device 1000 (refer to FIG. 1). The window 400 may include a glass film or a synthetic resin film as a base film. The window 400 may further include an anti-reflection film or an anti-fingerprint film. The window 400 may include a glass film or a synthetic resin film. The window 400 may further include a bezel pattern overlapping a peripheral area DP_NA (refer to FIG. 4A) of the display panel DP.

Figure 4A:
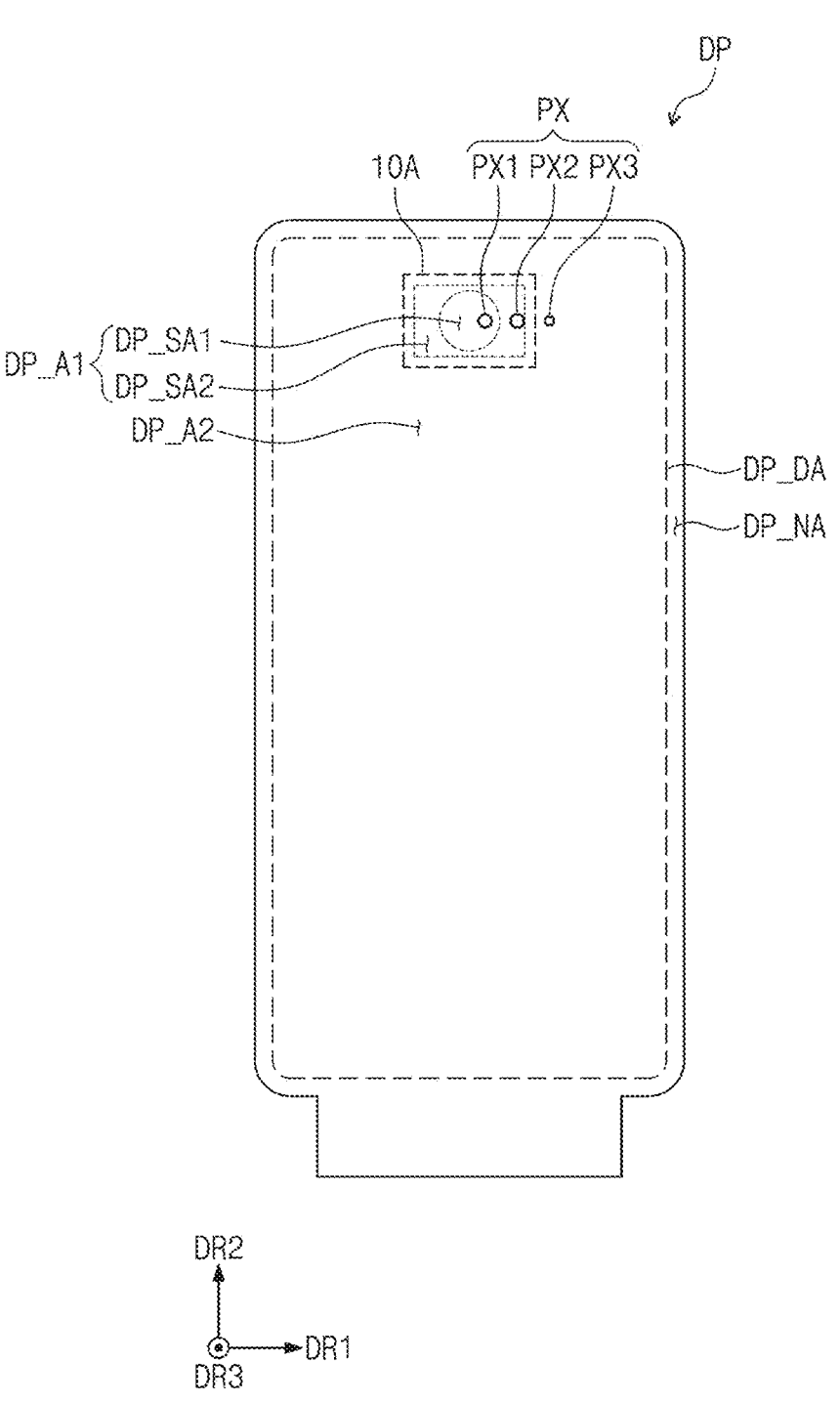
FIG. 4A is a plan view of a display panel according to an embodiment of the present disclosure.
Figure 4B:
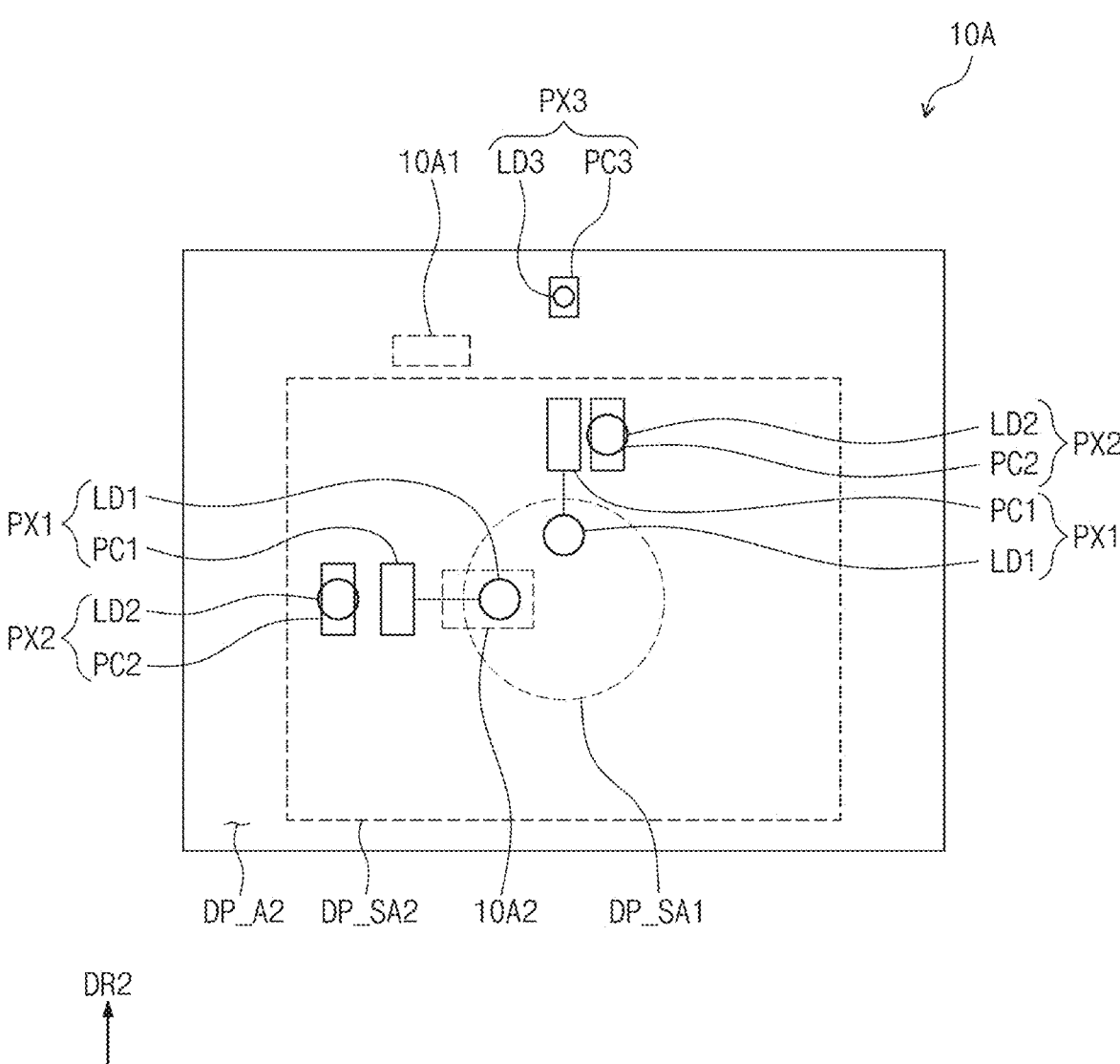
FIG. 4B is an enlarged plan view of a portion of FIG. 4A according to an embodiment of the present disclosure.
Figure 4C:
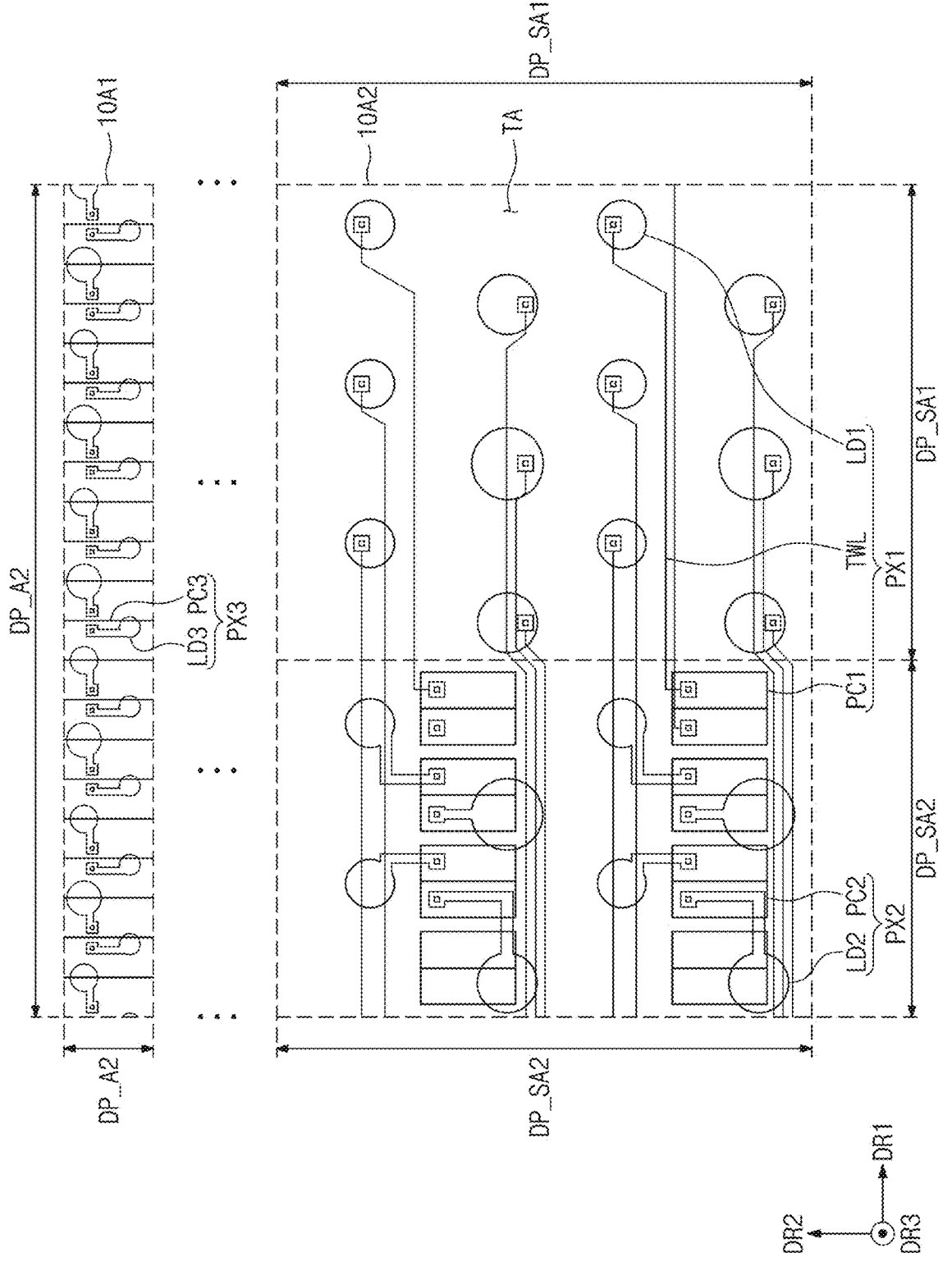
FIG. 4C is an enlarged plan view of portions of FIG. 4B according to an embodiment of the present disclosure.

FIG. 4A is a plan view of the display panel DP according to an embodiment of the present disclosure. FIG. 4B is an enlarged plan view of a portion 10A of FIG. 4A according to an embodiment of the present disclosure. FIG. 4C is an enlarged plan view of portions 10A1 and 10A2 of FIG. 4B according to an embodiment of the present disclosure.

Referring to FIG. 4A, the display panel DP may include a display area DP_DA and a peripheral area DP_NA. The peripheral area DP_NA may be adjacent to the display area DP_DA and may surround at least a portion of the display area DP_DA. The peripheral area DP_NA may correspond to the peripheral area DD_NA of FIG. 2.

The display area DP_DA may include a first area DP_A1 and a second area DP_A2. The first area DP_A1 may overlap the sensing area 10SA illustrated in FIG. 1 or the sensing area DD_SA illustrated in FIG. 2. The first area DP_A1 may include a first sub-area DP_SA1 and a second sub-area DP_SA2. In an embodiment, the first sub-area DP_SA1 may correspond to the sensing area DD_SA. The second sub-area DP_SA2 may be adjacent to the first sub-area DP_SA1 and may surround at least a portion of the first sub-area DP_SA1.

In an embodiment of the present disclosure, the first sub-area DP_SA1 may have a circular shape. However, without being limited thereto, the first sub-area DP_SA1 may have various shapes, such as, for example, a polygonal shape, an oval shape, the shape of a figure having at least one curved side, or an irregular shape. The second sub-area DP_SA2 may be located between the first sub-area DP_SA1 and the second area DP_A2. In an embodiment of the present disclosure, the second sub-area DP_SA2 may have a quadrilateral shape. However, without being limited thereto, the second sub-area DP_SA2 may have various shapes, such as, for example, a circular shape, an oval shape, a polygonal shape, the shape of a figure having at least one curved side, or an irregular shape.

In an embodiment of the present disclosure, the second sub-area DP_SA2 is illustrated as being surrounded by the second area DP_A2. However, without being limited thereto, one side of the second sub-area DP_SA2 may be in contact with the peripheral area DP_NA.

The display panel DP may include a plurality of pixels PX. The pixels PX may include a first pixel PX1 including a first light emitting element disposed in the first sub-area DP_SA1, a second pixel PX2 including a second light emitting element disposed in the second sub-area DP_SA2, and a third pixel PX3 including a third light emitting element disposed in the second area DP_A2. The first pixel PX1, the second pixel PX2, and the third pixel PX3 may include pixel circuits for driving the corresponding light emitting elements, respectively. The positions of the first pixel PX1, the second pixel PX2, and the third pixel PX3 illustrated in FIG. 4A are represented based on the positions of the corresponding light emitting elements.

A plurality of first pixels PX1, a plurality of second pixels PX2, and a plurality of third pixels PX3 may be provided. In this case, according to an embodiment, each of the first to third pixels PX1, PX2, and PX3 may be one of a red pixel, a green pixel, and a blue pixel, and according to an embodiment, may be a white pixel.

The first sub-area DP_SA1, the second sub-area DP_SA2, and the second area DP_A2 may be divided based on light transmittance or resolution. The light transmittance and resolution of each area may be values measured in the same reference area.

The first sub-area DP_SA1 may have a higher light transmittance than the second sub-area DP_SA2 and the second area DP_A2. The second sub-area DP_SA2 may have a higher light transmittance than the second area DP_A2. When the first sub-area DP_SA1, the second sub-area DP_SA2, and the second area DP_A2 are divided based on light transmittance, the first sub-area DP_SA1 may have a first light transmittance, the second sub-area DP_SA2 may have a second light transmittance lower than the first light transmittance, and the second area DP_A2 may have a third light transmittance lower than the second light transmittance. This is because the occupancy percentage of a light blocking structure in the first sub-area DP_SA1 is lower than those in the second sub-area DP_SA2 and the second area DP_A2 and the occupancy percentage of a light blocking structure in the second sub-area DP_SA2 is lower than that in the second area DP_A2. The area where the light blocking structure and light emitting elements are not disposed in the first sub-area DP_SA1 may be defined as a transmissive area TA (refer to FIG. 4C) capable of transmitting an optical signal. The light blocking structure may include a conductive pattern of a circuit layer, a pixel defining film, a black matrix, etc. that will be described below.

The second area DP_A2 may have a higher resolution than the first sub-area DP_SA1 and the second sub-area DP_SA2. The second area DP_A2 may have a larger number of light emitting elements in a reference area (or the same area) than the first sub-area DP_SA1 and the second sub-area DP_SA2. When the first sub-area DP_SA1, the second sub-area DP_SA2, and the second area DP_A2 are divided based on resolution, the first sub-area DP_SA1 may have a first resolution, the second sub-area DP_SA2 may have a second resolution higher than or equal to the first resolution, and the second area DP_A2 may have a third resolution higher than the second resolution. In an embodiment of the present disclosure, when the first sub-area DP_SA1 and the second sub-area DP_SA2 have the same resolution, the number of light emitting elements per reference area in the first sub-area DP_SA1 may be substantially the same as the number of light emitting elements per reference area in the second sub-area DP_SA2.

Referring to FIG. 4B, the first pixels PX1 may include first light emitting elements LD1 and first pixel circuits PC1 electrically connected to the first light emitting elements LD1. The second pixels PX2 may include second light emitting elements LD2 and second pixel circuits PC2 for driving the second light emitting elements LD2. The third pixels PX3 may include third light emitting elements LD3 and third pixel circuits PC3 for driving the third light emitting elements LD3.

The first light emitting elements LD1 are disposed in the first sub-area DP_SA1, and the first pixel circuits PC1 are disposed in the second sub-area DP_SA2. The second light emitting elements LD2 and the second pixel circuits PC2 are disposed in the second sub-area DP_SA2. The third light emitting elements LD3 and the third pixel circuits PC3 are disposed in the second area DP_A2.

To raise the light transmittance of the first sub-area DP_SA1, the first pixel circuits PC1 are moved from the first sub-area DP_SA1 to the second sub-area DP_SA2. The occupancy percentage of the transmissive area TA may be raised by removing a light blocking structure, such as a transistor, from the first sub-area DP-SA1. As a result, the light transmittance of the first sub-area DP_SA1 may be increased. The first pixel circuits PC1 may be disposed in the peripheral area DP_NA other than the second sub-area DP_SA2.

As illustrated in FIG. 4C, to increase the light transmittance of the first sub-area DP_SA1, the number of first light emitting elements LD1 in the reference area may be smaller than the number of third light emitting elements LD3 in the reference area. For example, the resolution of the first sub-area DP_SA1 may be equal to about ½, ⅜, ⅓, ¼, ⅖, ⅛, ⅑, or 1/16 of the resolution of the second area DP_A2. For example, the second area DP_A2 may have a resolution of about 400 ppi or more, and the first sub-area DP_SA1 may have a resolution of about 200 ppi or about 100 ppi. However, this is illustrative, and the resolutions of the second area DP_A2 and the first sub-area DP_SA1 are not limited thereto. However, to raise the luminance of an image displayed on the first sub-area DP_SA1, the first light emitting elements LD1, when comparing the first and third light emitting devices LD1 and LD3 that output the same color light, may be larger than the third light emitting elements LD3. The area where the first light emitting elements LD1 are not disposed in the first sub-area DP_SA1 may be defined as the transmissive area TA.

To secure areas where the first pixel circuits PC1 are to be disposed in the second sub-area DP_SA2, the number of second light emitting elements LD2 in the reference area may be smaller than the number of third light emitting elements LD3 in the reference area. The first pixel circuits PC1 are disposed in the areas where the second pixel circuits PC2 are not disposed in the second sub-area DP_SA2.

For example, the resolution of the second sub-area DP_SA2 may be equal to the resolution of the first sub-areas DP_SA1 and may be lower than the resolution of the second area DP_A2. To raise the luminance of an image displayed on the second sub-area DP_SA2, the second light emitting elements LD2, when comparing the second and third light emitting devices LD2 and LD3 that output the same color light, may be larger than the third light emitting elements LD3. When viewed based on the same color, the second light emitting elements LD2 may have the same size as the first light emitting elements LD1. However, embodiments of the present disclosure are not limited thereto. When comparing the first and second light emitting devices LD1 and LD2 that output the same color light, the second light emitting elements LD2 may have a different size from the first light emitting elements LD1.

The first light emitting elements LD1 may be electrically connected to the first pixel circuits PC1 through connecting lines TWL. The connecting lines TWL overlap the first sub-area DP_SA1 and the second sub-area DP_SA2. The connecting lines TWL may overlap the transmissive area TA of the first sub-area DP_SA1. At least a portion of each of the connecting lines TWL may include a transparent conductive material. Accordingly, the areas where the connecting lines TWL are disposed in the first sub-area DP_SA1 may also be included in the transmissive area TA.

The first to third light emitting elements LD1, LD2, and LD3 may have a circular shape. However, embodiments of the present disclosure are not limited thereto. The first to third light emitting elements LD1, LD2, and LD3 may have an oval shape or a polygonal shape. However, the edges of the first light emitting elements LD2 may have a curved shape. When the edges have a curved shape, diffraction of light may be minimized or reduced. For example, as the first light emitting elements LD1 disposed in the first sub-area DP_SA1 that transmits an optical signal have a circular shape or an oval shape, diffraction of light passing through the transmissive area TA may be minimized or reduced.

Figure 5A:
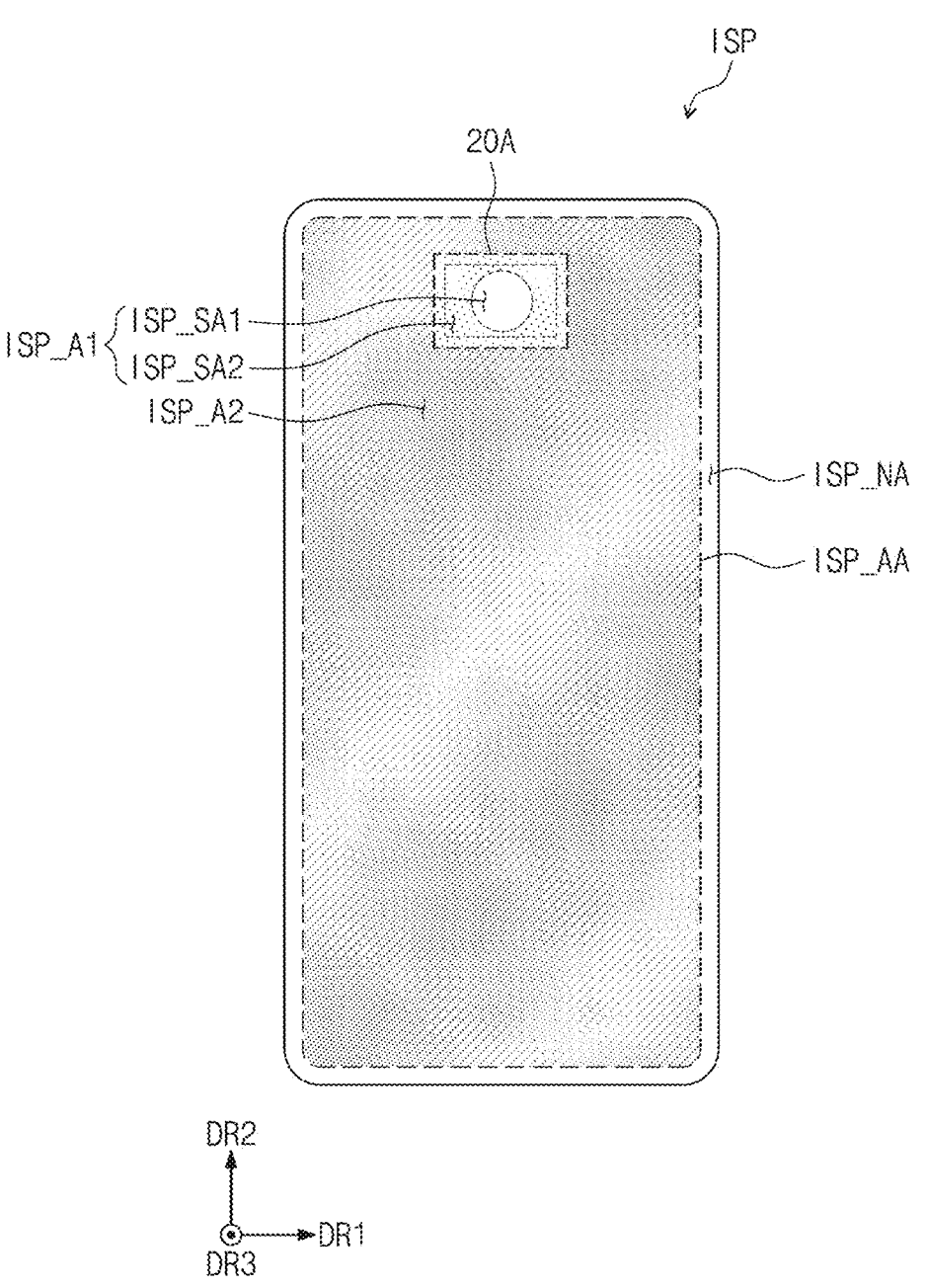
FIG. 5A is a plan view of an input sensor layer according to an embodiment of the present disclosure.
Figure 5B:
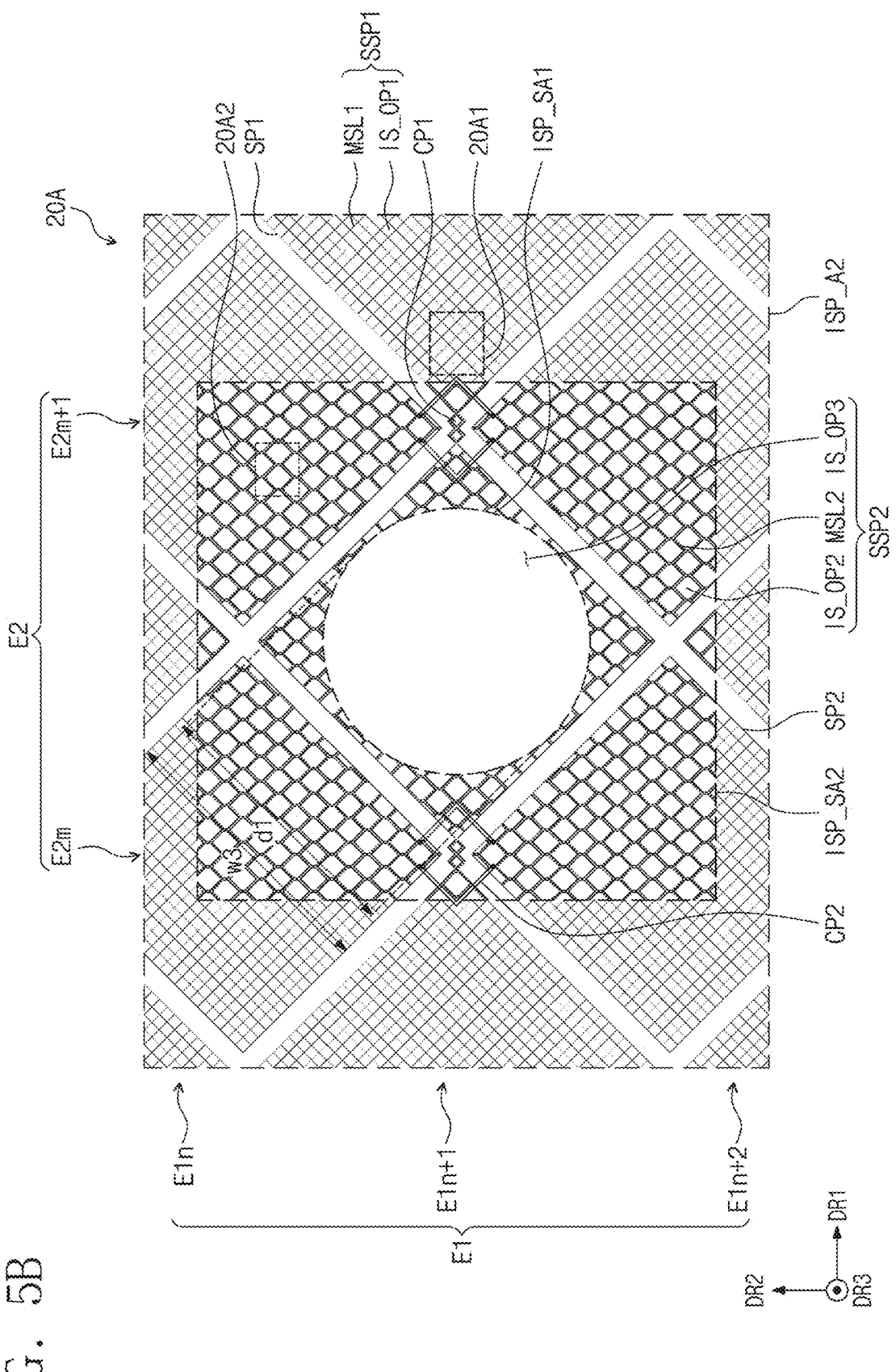
FIG. 5B is an enlarged plan view of a portion of FIG. 5A according to an embodiment of the present disclosure.
Figure 6A:
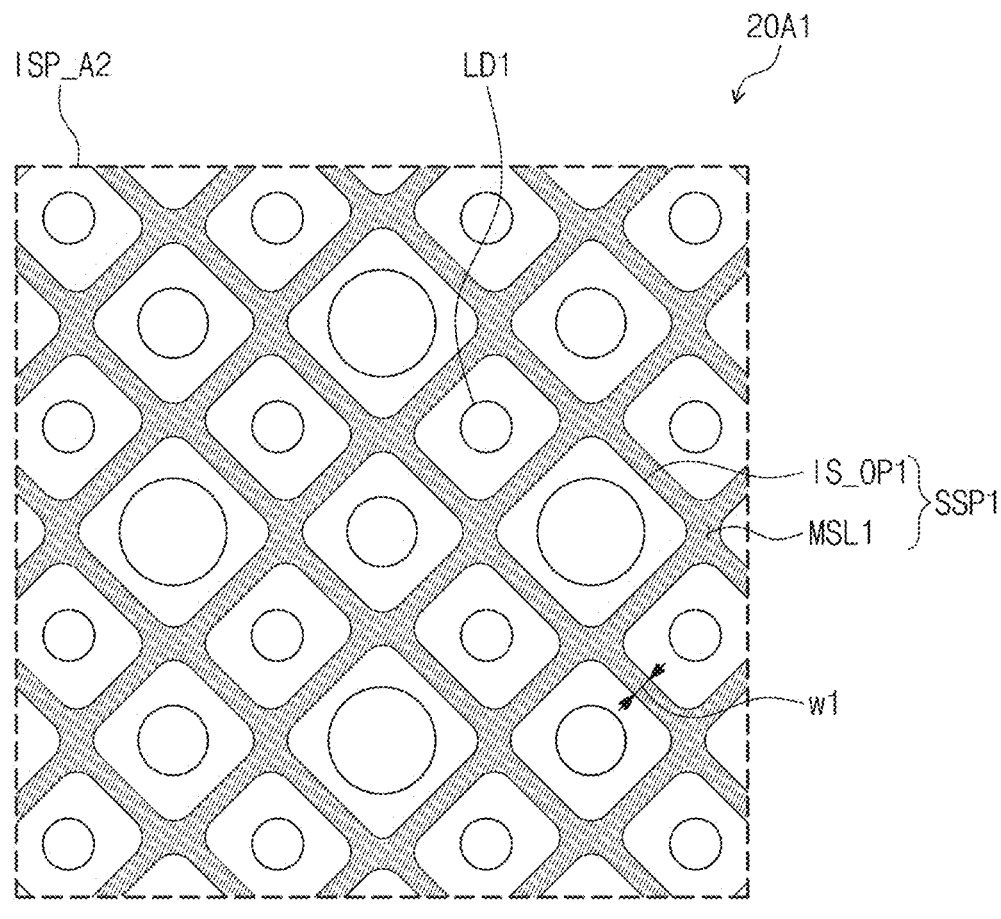
FIG. 6A is an enlarged view of a first portion of FIG. 5B according to an embodiment of the present disclosure.
Figure 6A:
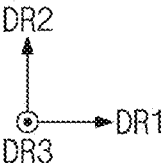

FIG. 5A is a plan view of the input sensor layer ISP according to an embodiment of the present disclosure. FIG. 5B is an enlarged plan view of a portion 20A of FIG. 5A according to an embodiment of the present disclosure. FIG. 6A is an enlarged view of a first portion 20A1 of FIG. 5B according to an embodiment of the present disclosure. FIG.

6B is an enlarged view of a second portion 20A2 of FIG. 5B according to an embodiment of the present disclosure.

Referring to FIGS. 5A and 5B, the input sensor layer ISP may include an effective area ISP_AA and an ineffective area ISP_NA. The ineffective area ISP_NA may be adjacent to the effective area ISP_AA and may surround at least a portion of the effective area ISP_AA. The effective area ISP_AA may be defined as an area capable of sensing an input applied from outside the electronic device 1000 (hereinafter referred to as the external input), and the ineffective area ISP_NA may be defined as an area incapable of sensing the external input. The external input may include various types of inputs, such as, for example, a part of the user's body, light, heat, or pressure. The external input may be an input (e.g., a touch input) using the user's body or an input using a separate input device. For example, the input device may be an active pen, a stylus pen, a touch pen, or an electronic pen.

The effective area ISP_AA may correspond to the display area DP_DA of FIG. 4A, and the ineffective area ISP_NA may correspond to the peripheral area DP_NA of FIG. 4A. The effective area ISP_AA may include a first area ISP_A1 and a second area ISP_A2. The first area ISP_A1 may overlap (or correspond to) the first area DP_A1 illustrated in FIG. 4A. The first area ISP_A1 may include a first sub-area ISP_SA1 and a second sub-area ISP_SA2. In an embodiment, the first sub-area ISP_SA1 may correspond to the first sub-area DP_SA1 of FIG. 4A, and the second sub-area ISP_SA2 may correspond to the second sub-area DP_SA2 of FIG. 4A.

In an embodiment of the present disclosure, the first sub-area ISP_SA1 may have a circular shape. However, without being limited thereto, the first sub-area ISP_SA1 may have various shapes, such as, for example, a polygonal shape, an oval shape, the shape of a figure having at least one curved side, or an irregular shape. The size and shape of the first sub-area ISP_SA1 may be related to the size and shape of the first sub-area DP_SA1 illustrated in FIG. 4A. For example, when the first sub-area DP_SA1 has a circular shape, the first sub-area ISP_SA1 may also have a size and a shape (e.g., a circular shape) corresponding to the first sub-area DP_SA1.

The second sub-area ISP_SA2 may be located between the first sub-area ISP_SA1 and the second area ISP_A2. In an embodiment of the present disclosure, the second sub-area ISP_SA2 may have a quadrilateral shape. However, without being limited thereto, the second sub-area ISP_SA2 may have various shapes, such as, for example, a circular shape, an oval shape, a polygonal shape, the shape of a figure having at least one curved side, or an irregular shape. The size and shape of the second sub-area ISP_SA2 may be related to the size and shape of the second sub-area DP_SA2 illustrated in FIG. 4A. For example, when the second sub-area DP_SA2 has a quadrilateral shape, the second sub-area ISP_SA2 may also have a size and a shape (e.g., a quadrilateral shape) corresponding to the second sub-area DP_SA2.

In an embodiment of the present disclosure, the second sub-area ISP_SA2 is illustrated as being surrounded by the second area ISP_A2. However, without being limited thereto, one side of the second sub-area ISP_SA2 may be in contact with the ineffective area ISP_NA.

The input sensor layer ISP may include a first group of electrodes E1, a second group of electrodes E2, and signal lines connected to the first group of electrodes E1 and the second group of electrodes E2. The first group of electrodes E1 and the second group of electrodes E2 may cross each other and may be driven in a mutual capacitance manner. In FIG. 5B, the n$^{th}$ to (n+2)th first electrodes E1*n*, E1*n*+1, and E1*n*+2 among the first group of electrodes E1 and the m$^{th}$ and (m+1)$^{th}$ second electrodes E2*m* and E2*m*+1 among the second group of electrodes E2 are illustrated. Here, "n" and "m" are natural numbers equal to at least 1.

The first group of electrodes E1 includes first sensing parts SP1 spaced apart from each other in the first direction DR1 and first connecting patterns CP1 connecting the first sensing parts SP1. Although FIG. 5B illustrates a structure in which two first sensing parts SP1 are connected through one first connecting pattern CP1, the number of first connecting patterns CP1 is not limited thereto. Furthermore, although the first sensing parts SP1 are illustrated as having a rhombic shape, the shape of the first sensing parts SP1 is not limited thereto and may be modified in various ways.

The second group of electrodes E2 includes second sensing parts SP2 spaced apart from each other in the second direction DR2 and second connecting patterns CP2 connecting the second sensing parts SP2. Although FIG. 5B illustrates a structure in which two second sensing parts SP2 are connected through two second connecting patterns CP2, the number of second connecting patterns CP2 is not limited thereto. Furthermore, although the second sensing parts SP2 are illustrated as having a rhombic shape, the shape of the second sensing parts SP2 is not limited thereto and may be modified in various ways.

Each of the first sensing parts SP1 may have a mesh shape, and each of the second sensing parts SP2 may have a mesh shape. Some of the first sensing parts SP1 may be disposed in the second area ISP_A2, and the other first sensing parts SP1 may be disposed in the first area ISP_A1. Similarly, some of the second sensing parts SP2 may be disposed in the second area ISP_A2, and the other second sensing parts SP2 may be disposed in the first area ISP_A1. Hereinafter, for convenience of description, the first and second sensing parts SP1 and SP2 disposed in the second area ISP_A2 are referred to as a first sensing pattern SSP1, and the first and second sensing parts SP1 and SP2 disposed in the first area ISP_A1 are referred to as a second sensing pattern SSP2.

The first sensing pattern SSP1 includes a plurality of first openings IS_OP1 overlapping the second area ISP_A2. The second sensing pattern SSP2 includes a plurality of second openings IS_OP2 overlapping the second sub-area ISP_SA2 and at least one third opening IS_OP3 overlapping the first sub-area ISP_SA1. In an embodiment of the present disclosure, each of the second openings IS_OP2 may be larger than each of the first openings IS_OP1. Furthermore, the third opening IS_OP3 may be larger than each of the second openings IS_OP2. In an embodiment of the present disclosure, the third opening IS_OP3 may have a size corresponding to the first sub-area ISP_SA1.

Figure 6B:
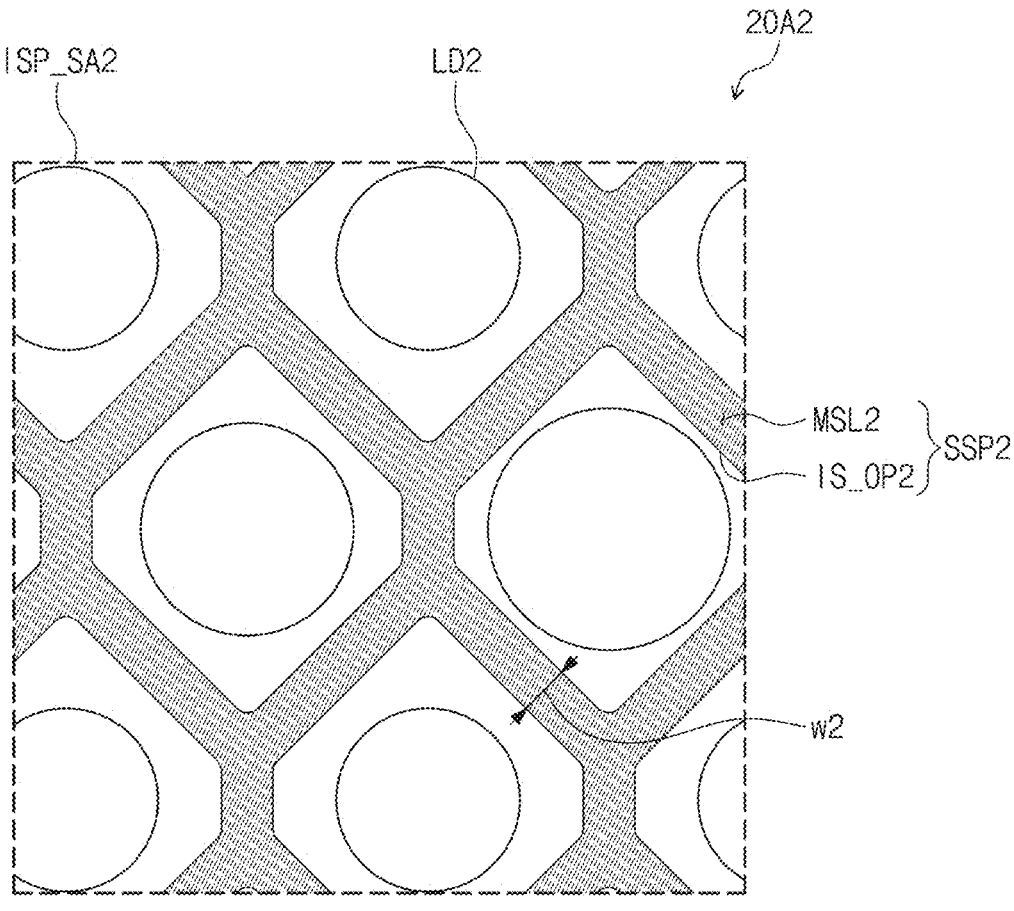
FIG. 6B is an enlarged view of a second portion of FIG. 5B according to an embodiment of the present disclosure.
Figure 6B:
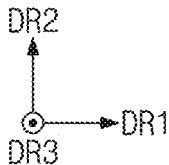

Referring to FIGS. 5B, 6A, and 6B, the first sensing pattern SSP1 further includes a first conductive line MSL1 that defines the plurality of first openings IS_OP1. The second sensing pattern SSP2 further includes a second conductive line MSL2 that defines the plurality of second openings IS_OP2. The line width w2 of the second conductive line MSL2 may be greater than the line width w1 of the first conductive line MSL1. In an embodiment of the present disclosure, the line width w1 of the first conductive line MSL1 may be about 4 μm, and the line width w2 of the second conductive line MSL2 may be about 10 μm.

The first and second connecting patterns CP1 and CP2 disposed in the second sub-area ISP_SA2 may have a greater line width than the first and second connecting patterns CP1 and CP2 disposed in the second area ISP_A2. The first and second connecting patterns CP1 and CP2 disposed in the second sub-area ISP_SA2 may have a shape the same as, or different from, the shape of the first and second connecting patterns CP1 and CP2 disposed in the second area ISP_A2.

The plurality of first openings IS_OP1 may have a different shape from the plurality of second openings IS_OP2. In an embodiment of the present disclosure, the plurality of the first openings IS_OP1 may have a quadrilateral shape, and the plurality of second openings IS_OP2 may have a hexagonal shape. However, this is illustrative, and the shapes of the plurality of first openings IS_OP1 and the plurality of second openings IS_OP2 are not particularly limited.

However, when the line width w2 of the second conductive line MSL2 is increased compared to the line width w1 of the first conductive line MSL1, the shape of the plurality of second openings IS_OP2 may differ from the shape of the first openings IS_OP1. If the plurality of second openings IS_OP2 are formed in a shape (e.g., a quadrilateral shape) the same as the shape of the plurality of first openings IS_OP1 even when the line width w2 of the second conductive line MSL2 is increased compared to the line width w1 of the first conductive line MSL1, the second conductive line MSL2 may overlap the second light emitting elements LD2 on the plane. That is, to increase the line width w2 of the second conductive line MSL2 without deterioration in light emission efficiency in the second sub-area ISP_A2, the shape of the second openings IS_OP2 may differ from the shape of the first openings IS_OP1.

In an embodiment, when the third opening IS_OP3 has a size corresponding to the first sub-area ISP_SA1, the second conductive line MSL2 is not disposed in the first sub-area ISP_SA1. That is, in an embodiment, the second conductive line MSL2 does not overlap the first sub-area ISP_SA1. When the second conductive line MSL2 does not overlap the first sub-area ISP_SA1, the light transmittance in the first sub-area ISP_SA1 may be increased.

The diameter d1 of the third opening IS_OP3 may be smaller than the width w3 of each of the first and second sensing parts SP1 and SP2. Accordingly, the size of the third opening IS_OP3 may be smaller than the size of each of the first and second sensing parts SP1 and SP2. For example, the width w3 of each of the first and second sensing parts SP1 and SP2 may be about 4 mm, and the diameter d1 of the third opening IS_OP3 may be about 3.3 mm. Alternatively, the diameter d1 of the third opening IS_OP3 may be greater than or equal to the width w3 of each of the first and second sensing parts SP1 and SP2. The case where the diameter d1 of the third opening IS_OP3 is greater than or equal to the width w3 of each of the first and second sensing parts SP1 and SP2 will be described below.

When the second conductive line MSL2 is not disposed in the first sub-area ISP_SA1, the light transmittance of the first sub-area ISP_SA1 may be increased, but the sensing sensitivity to an external input provided to the first area ISP_A1 may be deteriorated. However, by making the line width w2 of the second conductive line MSL2 disposed in the second sub-area ISP_SA2 larger than the line width w1 of the first conductive line MSL1, the sensing sensitivity lowered in the first sub-area ISP_SA1 may be supplemented (or compensated for) in the second sub-area ISP_SA2. Accordingly, the sensing sensitivity may be increased without deterioration in the light transmittance of the first area ISP_A1.

Figure 7A:
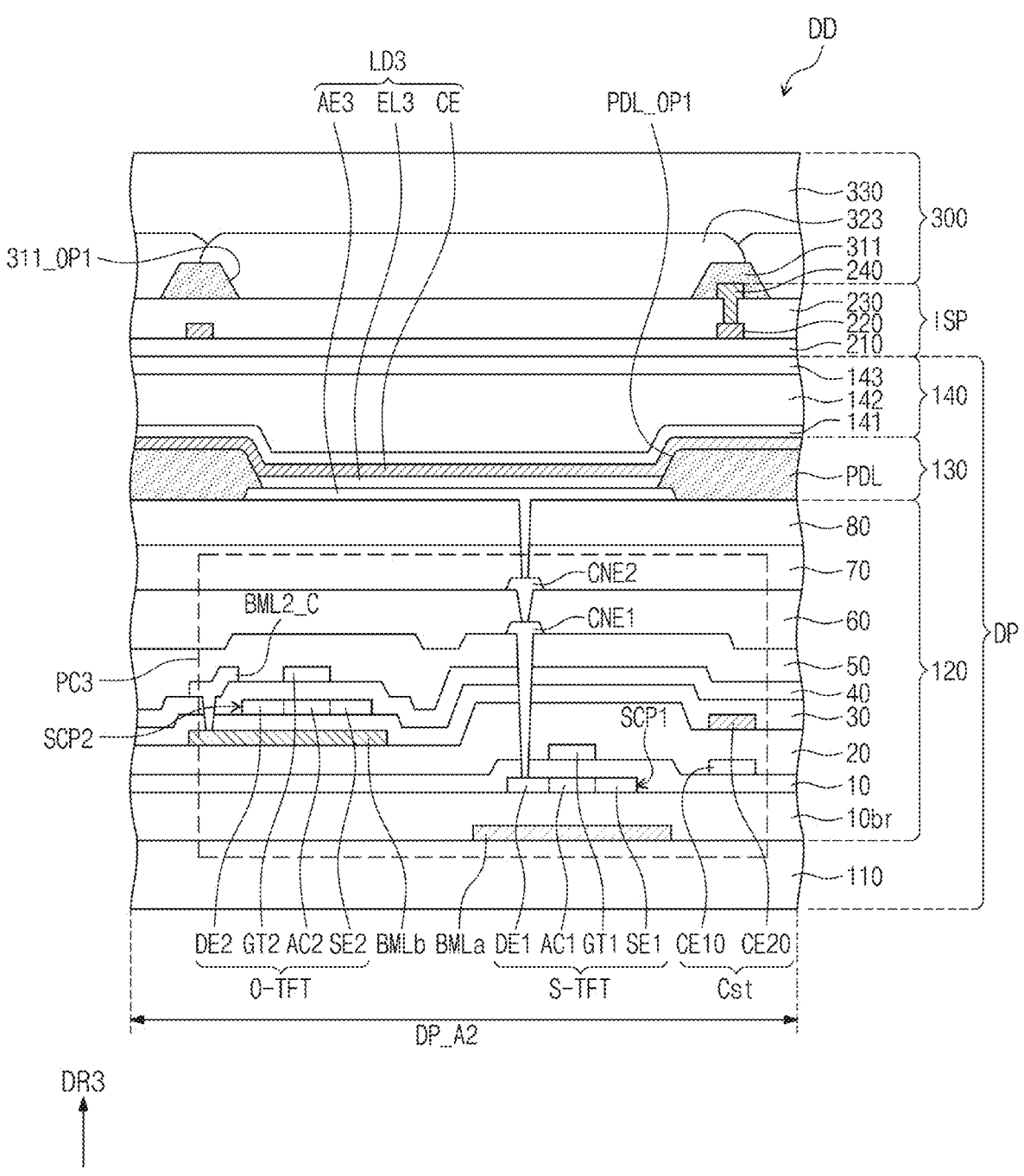
FIG. 7A is a cross-sectional view corresponding to a second area of the display device according to an embodiment of the present disclosure.
Figure 7B:
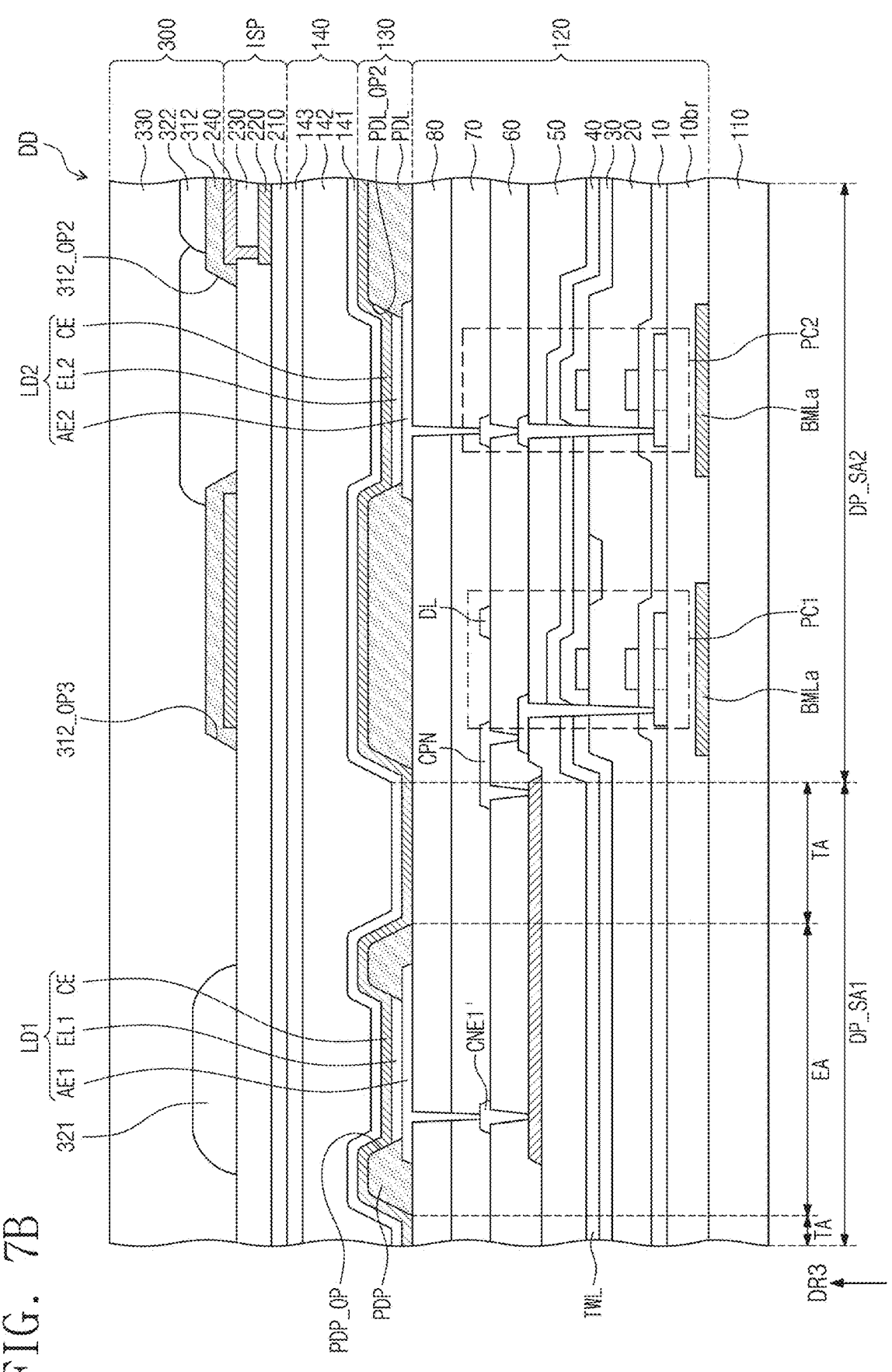
FIG. 7B is a cross-sectional view corresponding to a first area of the display device according to an embodiment of the present disclosure.
Figure 8A:
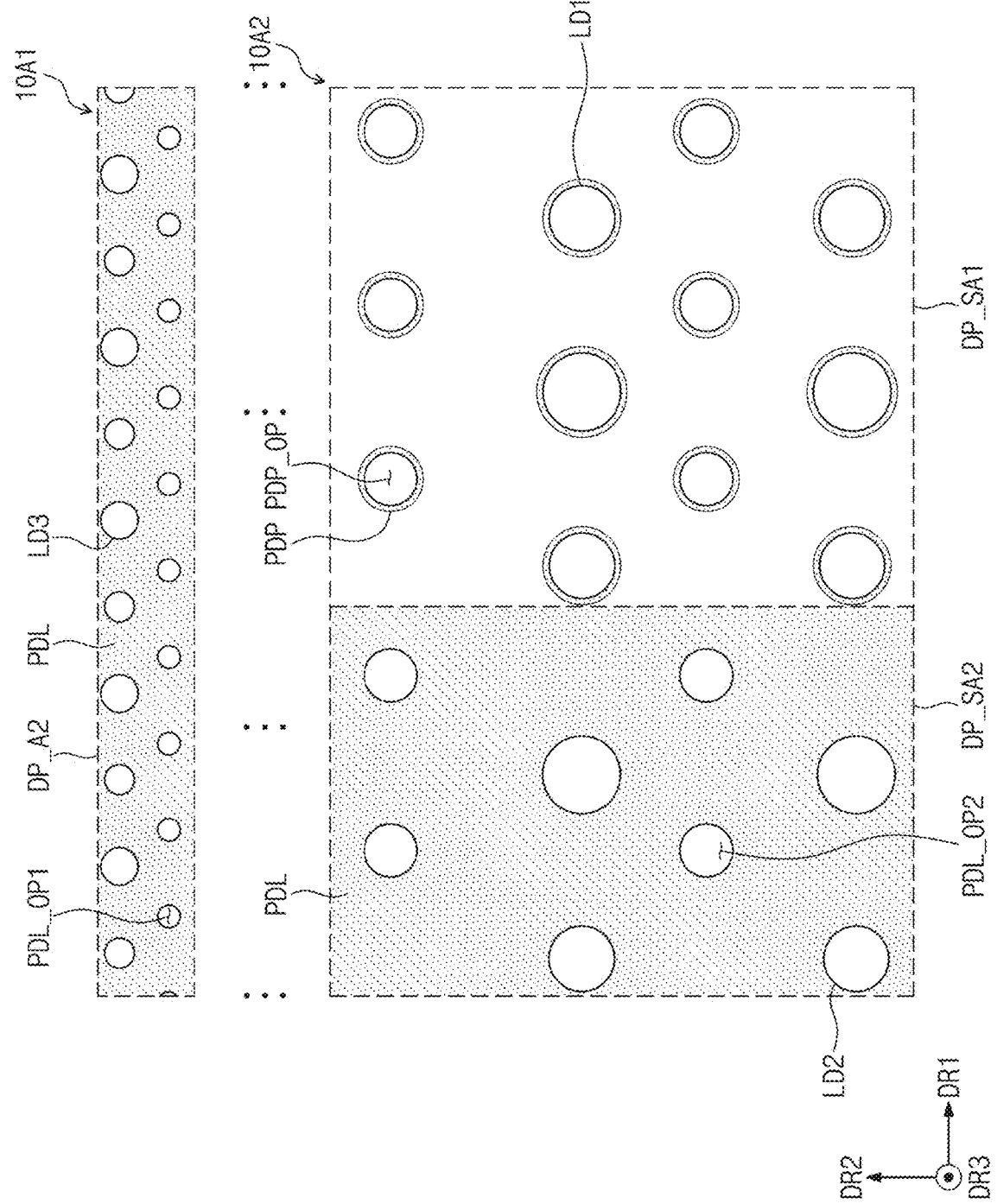
FIG. 8A is an enlarged plan view of portions of a light emitting element layer illustrated in FIGS. 7A and 7B according to an embodiment of the present disclosure.
Figure 8B:
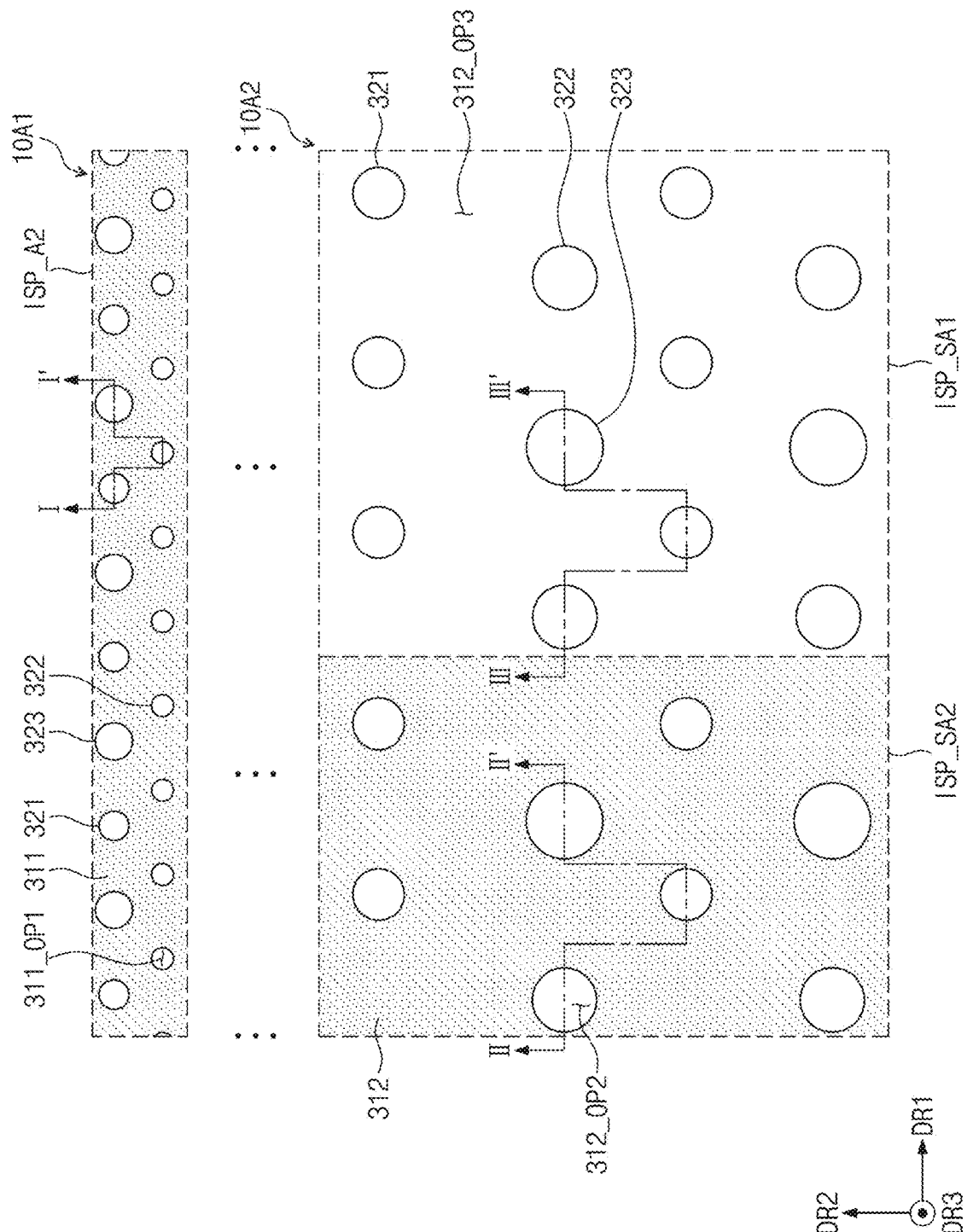
FIG. 8B is an enlarged plan view of portions of an anti-reflection layer illustrated in FIGS. 7A and 7B according to an embodiment of the present disclosure.

FIG. 7A is a cross-sectional view corresponding to the second area DP_A2 of the display device DD according to an embodiment of the present disclosure. FIG. 7B is a cross-sectional view corresponding to the first area DP_A1 of the display device DD according to an embodiment of the present disclosure. FIG. 8A is an enlarged plan view of portions 10A1 and 10A2 of the light emitting element layer 130 illustrated in FIGS. 7A and 7B according to an embodiment of the present disclosure. FIG. 8B is an enlarged plan view of portions 10A1 and 10A2 of the anti-reflection layer 300 illustrated in FIGS. 7A and 7B according to an embodiment of the present disclosure.

In FIG. 7A, the third light emitting element LD3 and a portion of the third pixel circuit PC3 (refer to FIG. 4C) are illustrated. In an embodiment of the present disclosure, the third pixel circuit PC3 may include a silicon transistor S-TFT and an oxide transistor O-TFT. In FIG. 7B, the first light emitting element LD1, a portion of the first pixel circuit PC1, the second light emitting element LD2, and a portion of the second pixel circuit PC2 are illustrated.

A buffer layer 10br may be disposed on the base layer 110. The buffer layer 10br may prevent or reduce diffusion of metal atoms or impurities from the base layer 110 to a first semiconductor pattern SCP1 disposed over the base layer 110. The first semiconductor pattern SCP1 includes an active area AC1 of the silicon transistor S-TFT. The buffer layer 10br may adjust the speed at which heat is provided during a crystallization process for forming the first semiconductor pattern SCP1, thereby enabling the first semiconductor pattern SCP1 to be uniformly formed.

A first black metal layer BMLa may be disposed under the silicon transistor S-TFT, and a second black metal layer BMLb may be disposed under the oxide transistor O-TFT. The first and second black metal layers BMLa and BMLb may overlap the first to third pixel circuits PC1, PC2, and PC3. The first and second black metal layers BMLa and BMLb may block travel of external light to the first to third pixel circuits PC1, PC2, and PC3.

The first black metal layer BMLa may correspond to at least a partial area of each of the first to third pixel circuits PC1, PC2, and PC3 (refer to FIG. 4C). The first black metal layer BMLa may be disposed between the base layer 110 and the buffer layer 10br. In an embodiment of the present disclosure, an inorganic barrier layer may be additionally disposed between the first black metal layer BMLa and the buffer layer 10br. The first black metal layer BMLa may be connected to an electrode or a line and may receive a constant voltage or a signal from the electrode or the line. According to an embodiment of the present disclosure, the first black metal layer BMLa may be a floating electrode isolated from another electrode or line.

The second black metal layer BMLb may correspond to a lower portion of the oxide transistor O-TFT. The second black metal layer BMLb may be disposed between a second insulating layer 20 and a third insulating layer 30. The second black metal layer BMLb may be disposed in the same layer as a second electrode CE20 of a storage capacitor Cst. The second black metal layer BMLb may be connected to a contact electrode BML2_C to receive a constant voltage or a signal. The contact electrode BML2_C may be disposed in the same layer as a gate GT2 of the oxide transistor O-TFT.

Each of the first black metal layer BMLa and the second black metal layer BMLb may include reflective metal. For example, each of the first black metal layer BMLa and the second black metal layer BMLb may include silver (Ag), an alloy including silver (Ag), molybdenum (Mo), an alloy including molybdenum, aluminum (Al), an alloy including aluminum, aluminum nitride (AlN), tungsten (W), tungsten nitride (WN), copper (Cu), and p+ doped amorphous silicon. The first black metal layer BMLa and the second black metal layer BMLb may include the same material, or may include different materials.

The second black metal layer BMLb may be omitted according to an embodiment of the present disclosure. The first black metal layer BMLa may extend to below the oxide transistor O-TFT and may block light incident toward the lower portion of the oxide transistor O-TFT.

The first semiconductor pattern SCP1 may be disposed on the buffer layer 10br. The first semiconductor pattern SCP1 may include a silicon semiconductor. For example, the silicon semiconductor may include amorphous silicon or polycrystalline silicon. For example, the first semiconductor pattern SCP1 may include low-temperature polycrystalline silicon.

The first semiconductor pattern SCP1 may have different electrical properties depending on whether the first semiconductor pattern SCP1 is doped. The first semiconductor pattern SCP1 may include a conductive area having a high conductivity and a channel area having a low conductivity. The conductive area may be doped with an N-type dopant or a P-type dopant. A P-type transistor may include a doped area doped with a P-type dopant, and an N-type transistor may include a doped area doped with an N-type dopant. The channel area may be an undoped area, or may be an area more lightly doped than the conductive area.

The conductive area may have a higher conductivity than the channel area and may substantially serve as an electrode or a signal line. The channel area may substantially correspond to an active area of a transistor. For example, a portion of the first semiconductor pattern SCP1 may be an active area of a transistor, another portion may be a source or a drain of the transistor, and another portion may be a connecting electrode or a connecting signal line.

A source area (or a source) SE1, the active area (or the channel area) AC1, and a drain area (or a drain) DE1 of the silicon transistor S-TFT may be formed from the first semiconductor pattern SCP1. The source area SE1 and the drain area DE1 may extend from the active area AC1 in opposite directions in the cross-section.

A first insulating layer 10 may be disposed on the buffer layer 10br. The first insulating layer 10 may commonly overlap a plurality of pixels and may cover the first semiconductor pattern SCP1. The first insulating layer 10 may be an inorganic layer and/or an organic layer and may have a single-layer structure or a multi-layer structure. The first insulating layer 10 may include at least one of, for example, aluminum oxide, titanium oxide, silicon oxide, silicon nitride, silicon oxy-nitride, zirconium oxide, or hafnium oxide. In an embodiment, the first insulating layer 10 may be a single layer of silicon oxide. Not only the first insulating layer 10, but also, insulating layers of the circuit layer 120 to be described below, may be inorganic layers and/or organic layers and may have a single-layer structure or a multi-layer structure. The inorganic layers may include at least one of the aforementioned materials, but are not limited thereto.

A gate GT1 of the silicon transistor S-TFT is disposed on the first insulating layer 10. The gate GT1 may be a portion of a metal pattern. The gate GT1 may overlap the active area AC1. The gate GT1 may function as a mask in a process of doping the first semiconductor pattern SCP1. The gate GT1 may include, for example, titanium (Ti), silver (Ag), an alloy including silver, molybdenum (Mo), an alloy including molybdenum, aluminum (Al), an alloy including aluminum, aluminum nitride (AlN), tungsten (W), tungsten nitride (WN), copper (Cu), indium tin oxide (ITO), or indium zinc oxide (IZO), but is not particularly limited thereto.

The second insulating layer 20 may be disposed on the first insulating layer 10 and may cover the gate GT1. The third insulating layer 30 may be disposed on the second insulating layer 20. The second electrode CE20 of the storage capacitor Cst may be disposed between the second insulating layer 20 and the third insulating layer 30. Furthermore, a first electrode CE10 of the storage capacitor Cst may be disposed between the first insulating layer 10 and the second insulating layer 20.

A second semiconductor pattern SCP2 may be disposed on the third insulating layer 30. The second semiconductor pattern SCP2 may include an active area AC2 of the oxide transistor O-TFT to be described below. The second semiconductor pattern SCP2 may include an oxide semiconductor. The second semiconductor pattern SCP2 may include, for example, transparent conductive oxide (TCO) such as indium tin oxide (ITO), indium zinc oxide (IZO), indium gallium zinc oxide (IGZO), zinc oxide (ZnOx), or indium oxide ($In_2O_3$).

The oxide semiconductor may include a plurality of areas distinguished depending on whether transparent conductive oxide is reduced. The area where the transparent conductive oxide is reduced (hereinafter referred to as the reduced area) has a higher conductivity than the area where the transparent conductive oxide is not reduced (hereinafter referred to as the non-reduced area). The reduced area may substantially serve as a source/drain of a transistor or a signal line. The non-reduced area may substantially correspond to a semiconductor area (or an active area or a channel) of the transistor. For example, one partial area of the second semiconductor pattern SCP2 may be a semiconductor area of a transistor, another partial area may be a source area/drain area of the transistor, and another partial area may be a signal transmission area.

A source area (or a source) SE2, the active area (or the channel area) AC2, and a drain area (or a drain) DE2 of the oxide transistor O-TFT may be formed from the second semiconductor pattern SCP2. The source area SE2 and the drain area DE2 may extend from the active area AC2 in opposite directions in the cross-section.

A fourth insulating layer 40 may be disposed on the third insulating layer 30. As illustrated in FIG. 7A, the fourth insulating layer 40 may overlap the gate GT2 of the oxide transistor O-TFT and may cover the second semiconductor pattern SCP2.

The gate GT2 of the oxide transistor O-TFT may be disposed on the fourth insulating layer 40. The gate GT2 of the oxide transistor O-TFT may be a portion of a metal pattern. The gate GT2 of the oxide transistor O-TFT may overlap the active area AC2.

A fifth insulating layer 50 may be disposed on the fourth insulating layer 40 and may cover the gate GT2 and the contact electrode BML2_C. A first connecting electrode CNE1 may be disposed on the fifth insulating layer 50. The first connecting electrode CNE1 may be connected to the drain area DE1 of the silicon transistor S-TFT through a contact hole penetrating the first to fifth insulating layers 10, 20, 30, 40, and 50.

A sixth insulating layer 60 may be disposed on the fifth insulating layer 50. A second connecting electrode CNE2 may be disposed on the sixth insulating layer 60. The second connecting electrode CNE2 may be connected to the first connecting electrode CNE1 through a contact hole penetrating the sixth insulating layer 60. A seventh insulating layer 70 may be disposed on the sixth insulating layer 60 and may cover the second connecting electrode CNE2. An eighth insulating layer 80 may be disposed on the seventh insulating layer 70.

Each of the sixth insulating layer 60, the seventh insulating layer 70, and the eighth insulating layer 80 may be an organic layer. For example, each of the sixth insulating layer 60, the seventh insulating layer 70, and the eighth insulating layer 80 may include a general purpose polymer, such as benzocyclobutene (BCB), polyimide, hexamethyldisiloxane (HMDSO), Polymethylmethacrylate (PMMA), or Polystyrene (PS), a polymer derivative having a phenolic group, an acrylate-based polymer, an imide-based polymer, an aryl ether-based polymer, an amide-based polymer, a fluorine-based polymer, a p-xylene-based polymer, a vinyl alcohol-based polymer, or a blend thereof.

The third light emitting element LD3 may include a first electrode (or a pixel electrode) AE3, an emissive layer EL3, and a second electrode (or a common electrode) CE. A second electrode CE of the first light emitting element LD1 and a second electrode CE of the second light emitting element LD2, which will be described below, may have an integral shape with the second electrode CE of the third light emitting element LD3. That is, the second electrode CE may be commonly provided for the first light emitting element LD1, the second light emitting element LD2, and the third light emitting element LD3.

The first electrode AE3 of the third light emitting element LD3 may be disposed on the eighth insulating layer 80. The first electrode AE3 of the third light emitting element LD3 may be a (semi) transmissive electrode or a reflective electrode. According to an embodiment of the present disclosure, the first electrode AE3 of the third light emitting element LD3 may include a reflective layer formed of Ag, Mg, Al, Pt, Pd, Au, Ni, Nd, Ir, Cr, or a compound thereof and a transparent or translucent electrode layer formed on the reflective layer. The transparent or translucent electrode layer may include at least one of, for example, indium tin oxide (ITO), indium zinc oxide (IZO), indium gallium zinc oxide (IGZO), zinc oxide (ZnO), or indium oxide ($In_2O_3$) and aluminum-doped zinc oxide (AZO). For example, the first electrode AE3 of the third light emitting element LD3 may include a stacked structure of ITO/Ag/ITO.

Referring to FIGS. 7A and 8A, a pixel defining layer PDL may be disposed on the eighth insulating layer 80. The pixel defining layer PDL may have a property of absorbing light. For example, the pixel defining layer PDL may be black in color. The pixel defining layer PDL may include a black coloring agent. The black coloring agent may include a black dye or a black pigment. The black coloring agent may include carbon black, a metal such as chromium, or an oxide thereof. The pixel defining layer PDL may correspond to a light blocking pattern having light blocking characteristics.

The pixel defining layer PDL may cover a portion of the first electrode AE3 of the third light emitting element LD3. For example, the pixel defining layer PDL may have a first pixel opening PDL_OP1 defined therein through which a portion of the first electrode AE3 of the third light emitting element LD3 is exposed. The pixel defining layer PDL may increase the distance between the periphery of the first electrode AE3 of the third light emitting element LD3 and the second electrode CE. Accordingly, the pixel defining layer PDL may serve to prevent an arc from occurring at the periphery of the first electrode AE3.

According to an embodiment, a hole control layer may be disposed between the first electrode AE3 and the emissive layer EL3. The hole control layer may include a hole transporting layer and may further include a hole injection layer. An electron control layer may be disposed between the emissive layer EL3 and the second electrode CE. The electron control layer may include an electron transporting layer and may further include an electron injection layer. The hole control layer and the electron control layer may be commonly formed for the plurality of pixels PX (refer to FIG. 4A) by using an open mask.

The encapsulation layer 140 may be disposed on the light emitting element layer 130. The encapsulation layer 140 may include an inorganic layer 141, an organic layer 142, and an inorganic layer 143 sequentially stacked one above another. However, layers constituting the encapsulation layer 140 are not limited thereto.

The inorganic layers 141 and 143 may protect the light emitting element layer 130 from moisture and oxygen, and the organic layer 142 may protect the light emitting element layer 130 from foreign matter such as dust particles. The inorganic layers 141 and 143 may include, for example, a silicon nitride layer, a silicon oxy-nitride layer, a silicon oxide layer, a titanium oxide layer, or an aluminum oxide layer. The organic layer 142 may include, but is not limited to, an acrylate-based organic layer.

The input sensor layer ISP may be disposed on the display panel DP. The input sensor layer ISP may include an insulating base layer 210, a first conductive layer 220, a sensing insulation layer 230, and a second conductive layer 240.

The insulating base layer 210 may be directly disposed on the display panel DP (e.g., the encapsulation layer 140). The insulating base layer 210 may be an inorganic layer including at least one of, for example, silicon nitride, silicon oxy-nitride, or silicon oxide. Alternatively, the insulating base layer 210 may be an organic layer including, for example, an epoxy resin, an acrylic resin, or an imide-based resin. The insulating base layer 210 may have a single-layer structure, or may have a multi-layer structure stacked in the third direction DR3.

Each of the first conductive layer 220 and the second conductive layer 240 may have a single-layer structure, or may have a multi-layer structure stacked in the third direction DR3. One (e.g., the second conductive layer 240) of the first conductive layer 220 and the second conductive layer 240 may include the first and second conductive lines MSL1 and MSL2 (refer to FIG. 5B) that define the first and second sensing patterns SSP1 and SSP2 (refer to FIG. 5B). The other one (e.g., the first conductive layer 220) of the first conductive layer 220 and the second conductive layer 240 may include the second connecting pattern CP2.

The first and second conductive lines MSL1 and MSL2 do not overlap the first pixel opening PDL_OP1 and overlap the pixel defining layer PDL.

The first and second conductive layers 220 and 240 having a single-layer structure may include a metal layer or a transparent conductive layer. The metal layer may include, for example, molybdenum, silver, titanium, copper, aluminum, or an alloy thereof. The transparent conductive layer may include, for example, a transparent conductive oxide such as indium tin oxide (ITO), indium zinc oxide (IZO), zinc oxide (ZnO), indium zinc tin oxide (IZTO), etc. In addition, the transparent conductive layer may include a conductive polymer such as, for example, PEDOT, a metal nano wire, or graphene.

The first and second conductive layers 220 and 240 having a multi-layer structure may include metal layers. The metal layers may have, for example, a three-layer structure of titanium/aluminum/titanium. The first and second conductive layers 220 and 240 having a multi-layer structure may include at least one metal layer and at least one transparent conductive layer.

The sensing insulation layer 230 may be disposed between the first conductive layer 220 and the second conductive layer 240. The sensing insulation layer 230 may include an inorganic film. The inorganic film may include at least one of, for example, aluminum oxide, titanium oxide, silicon oxide, silicon nitride, silicon oxy-nitride, zirconium oxide, or hafnium oxide.

Alternatively, the sensing insulation layer 230 may include an organic film. The organic film may include at least one of, for example, an acrylate-based resin, a methacrylate-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

The anti-reflection layer 300 may be disposed on the input sensor layer ISP. The anti-reflection layer 300 may include a first dividing layer 311, a second dividing layer 312, a first color filter 321, a second color filter 322, a third color filter 323, and a planarization layer 330.

The first color filter 321, the second color filter 322, and the third color filter 323 may have different colors. The color of the first color filter 321, the second color filter 322, and the third color filter 323 may be one of red, green, and blue. The first color filter 321, the second color filter 322, and the third color filter 323 may be arranged in a predetermined form. For example, the first color filter 321, the second color filter 322, and the third color filter 323 may be disposed in consideration of light emission colors of the light emitting elements included in the display panel DP. Furthermore, the first color filter 321, the second color filter 322, and the third color filter 323 may have different sizes. When the light emitting elements included in the display panel DP have different sizes, each of the first color filter 321, the second color filter 322, and the third color filter 323 may have a size corresponding to the size of a corresponding one of the light emitting elements.

Any material capable of absorbing light may be used for the first and second dividing layers 311 and 312 without any specific limitation. The first and second dividing layers 311 and 312 may be black layers. In an embodiment, the first and second dividing layers 311 and 312 may include a black coloring agent. The black coloring agent may include a black dye or a black pigment. The black coloring agent may include, for example, carbon black, metal such as chromium, or an oxide thereof.

The first and second dividing layers 311 and 312 may cover the second conductive layer 240 of the input sensor layer ISP. The first and second dividing layers 311 and 312 may prevent or reduce reflection of external light by the second conductive layer 240. In an embodiment, the first dividing layer 311 may overlap the second area ISP_A2 (refer to FIG. 5B), and the second dividing layer 312 may overlap the second sub-area ISP_SA2 (refer to FIG. 5B) and does not overlap the first sub-area ISP_SA1 (refer to FIG. 5B). That is, in an embodiment, as the second dividing layer 312 is not disposed in the first sub-area ISP_SA1, the light transmittance of the first sub-area ISP_SA1 may be further increased.

Referring to FIGS. 7A and 8B, a first opening pattern 311_OP1 may be defined in the first dividing layer 311. The first opening pattern 311_OP1 may overlap the first electrode AE3 of the third light emitting element LD3. In the second area ISP_A2, the first opening pattern 311_OP1 may overlap the first color filter 321, the second color filter 322, or the third color filter 323. The first color filter 321, the second color filter 322, or the third color filter 323 may cover the first opening pattern 311_OP1. Each of the first color filter 321, the second color filter 322, and the third color filter 323 may overlap and make contact with the first dividing layer 311 adjacent thereto.

The planarization layer 330 may cover the first dividing layer 311 and the first to third color filters 321, 322, and 323. The planarization layer 330 may include an organic material and may provide a flat surface on the upper surface of the planarization layer 330. In an embodiment of the present disclosure, the planarization layer 330 may be omitted.

Unlike in FIG. 7A, oxide transistors O-TFT of the first and second pixel circuits PC1 and PC2 are not illustrated in FIG. 7B. However, each of the first and second pixel circuits PC1 and PC2 has a structure similar to the structure of the third pixel circuit PC3 described with reference to FIG. 7A, and therefore detailed descriptions of the first and second pixel circuits PC1 and PC2 are omitted for convenience of description.

A first electrode AE1 of the first light emitting element LD1 may be electrically connected to the first pixel circuit PC1 disposed in the second sub-area DP-SA2. The first electrode AE1 of the first light emitting element LD1 may be electrically connected to a silicon transistor S-TFT or an oxide transistor O-TFT. In FIG. 7B, the first electrode AE1 of the first light emitting element LD1 connected to the silicon transistor S-TFT is illustrated.

The first electrode AE1 of the first light emitting element LD1 may be electrically connected to the first pixel circuit PC1 through a connecting line TWL and connecting electrodes CNE1', CNE2', and CPN. According to an embodiment of the present disclosure, one of the connecting electrodes CNE1' and CPN may be omitted. The connecting electrode CNE1' may directly connect the connecting line TWL and the silicon transistor S-TFT. In an embodiment, the connecting electrode CNE2' may be omitted, and the first electrode AE1 may be directly connected to the connecting line TWL.

The connecting line TWL may overlap the transmissive area TA. The connecting line TWL may include a light transmissive material. The connecting line TWL may include transparent conductive oxide (TCO) such as, for example, indium tin oxide (ITO), indium zinc oxide (IZO), indium gallium zinc oxide (IGZO), zinc oxide (ZnOx), or indium oxide ($In_2O_3$). Even though the connecting line TWL overlaps the transmissive area TA through which an optical signal moves, the transparent connecting line TWL may minimize or reduce distortion of an optical signal, such as diffraction.

In an embodiment, the connecting line TWL overlaps the first sub-area DP_SA1 and the second sub-area DP_SA2 and is disposed on the third insulating layer 30. The fourth insulating layer 40 may cover the connecting line TWL. The connecting line TWL does not overlap the second area DP_A2 (refer to FIG. 7A).

The connecting line TWL may be disposed on the same insulating layer as the second semiconductor pattern SP2. The connecting line TWL may be formed from the same native oxide semiconductor layer as the second semiconductor pattern SP2. The native oxide semiconductor layer is divided into a plurality of patterns through an etching process. The plurality of patterns include the second semiconductor pattern SP2 and the connecting line TWL.

However, the second semiconductor pattern SP2 and the connecting line TWL have different electrical properties because subsequent processes are not identical to each other. The connecting line TWL may have conductivity corresponding to the source area SE2 and the drain area DE2 of the second semiconductor pattern SP2. The following description will focus on the connecting line TWL and the source area SE2 of the second semiconductor pattern SP2.

The connecting line TWL and the source area SE2 of the second semiconductor pattern SP2 may have a higher conductivity than the active area AC2 of the second semiconductor pattern SP2. The connecting line TWL and the source area SE2 of the second semiconductor pattern SP2 may have a higher fluorine content than the active area AC2 of the second semiconductor pattern SP2. In the process of forming the fourth insulating layer 40 of the insulating pattern, a fluorinated gas, such as $CF_4$ and/or $SF_6$, is used as an etching gas. This is because oxygen of transparent conductive oxide (TCO) is replaced with fluorine. A dry etching process using a fluorinated gas has a result similar to the result obtained by doping the transparent conductive oxide (TCO) with fluorine.

According to embodiments of the present disclosure, the conductivity of the reduced transparent conductive oxide (TCO) is increased, and the active area AC2 of the second semiconductor pattern SP2 has a relatively low fluorine content because the gate GT2 masks a fluorinated gas.

The connecting line TWL may have a higher conductivity than the source area SE2 of the second semiconductor pattern SP2. The doping concentrations of the connecting line TWL and the source area SE2 of the second semiconductor pattern SP2 may be adjusted through a doping process. The connecting line TWL may further include, for example, aluminum (Al), arsenic (As), boron (B), or silicon (Si) used as a dopant, compared to the source area SE2 of the second semiconductor pattern SP2. The connecting line TWL may have higher dopant content than the source area SE2 of the second semiconductor pattern SP2. A detailed process of forming the second semiconductor pattern SP2 and the connecting line TWL will be described below.

Referring to FIGS. 7B and 8A, the pixel defining layer PDL may cover a portion of a first electrode AE2 of the second light emitting element LD2. For example, the pixel defining layer PDL may have a second pixel opening PDL_OP2 defined therein through which a portion of the first electrode AE2 of the second light emitting element LD2 is exposed. The pixel defining layer PDL may increase the distance between the periphery of the first electrode AE2 of the second light emitting element LD2 and the second electrode CE thereof. Accordingly, the pixel defining layer PDL may serve to prevent an arc from occurring at the periphery of the first electrode AE2.

In an embodiment of the present disclosure, the second pixel opening PDL_OP2 may have a larger size than the first pixel opening PDL_OP1. The second pixel opening PDL_OP2 may overlap the second sub-area DP_SA2.

A pixel defining pattern PDP may be disposed on the eighth insulating layer 80 to overlap the first sub-area DP_SA1. The pixel defining pattern PDP may include the same material as the pixel defining layer PDL and may be formed through the same process as the pixel defining layer PDL. The pixel defining pattern PDP may cover a portion of the first electrode AE1 of the first light emitting element LD1. For example, the pixel defining pattern PDP may have a third pixel opening PDP_OP defined therein through which a portion of the first electrode AE1 of the first light emitting element LD1 is exposed. The pixel defining pattern PDP may cover the periphery of the first electrode AE1 of the first light emitting element LD1 and may suppress occurrence of an arc like the pixel defining layer PDL. In the first sub-area DP-SA1, the area overlapping the portion where the first electrode AE1 of the first light emitting element LD1 and the pixel defining pattern PDP are disposed may be defined as an element area EA, and the remaining area may be defined as a transmissive area TA.

Referring to FIGS. 7B and 8B, a second opening pattern 312_OP2 may be defined in the second dividing layer 312. The second opening pattern 312_OP2 may overlap the first electrode AE2 of the second light emitting element LD2. In the second sub-area ISP_SA2, the second opening pattern 312_OP2 may overlap the first color filter 321, the second color filter 322, or the third color filter 323. The first color filter 321, the second color filter 322, or the third color filter 323 may cover the second opening pattern 312_OP2. Each of the first color filter 321, the second color filter 322, and the third color filter 323 may overlap and make contact with the second dividing layer 312 adjacent thereto.

A third opening pattern 312_OP3 may be defined in the second dividing layer 312. The third opening pattern 312_OP3 may have a size corresponding to the first sub-area ISP_SA1. That is, the first to third color filters 321, 322, and 323 may be spaced apart from the second dividing layer 312 because the second dividing layer 312 does not overlap the first sub-area ISP_SA1. For example, according to embodiments, in the first sub-area ISP_SA1, the first to third color filters 321, 322, and 323 do not make contact with the second dividing layer 312.

The planarization layer 330 may cover the second dividing layer 312 and the first to third color filters 321, 322, and 323.

Figure 9A:
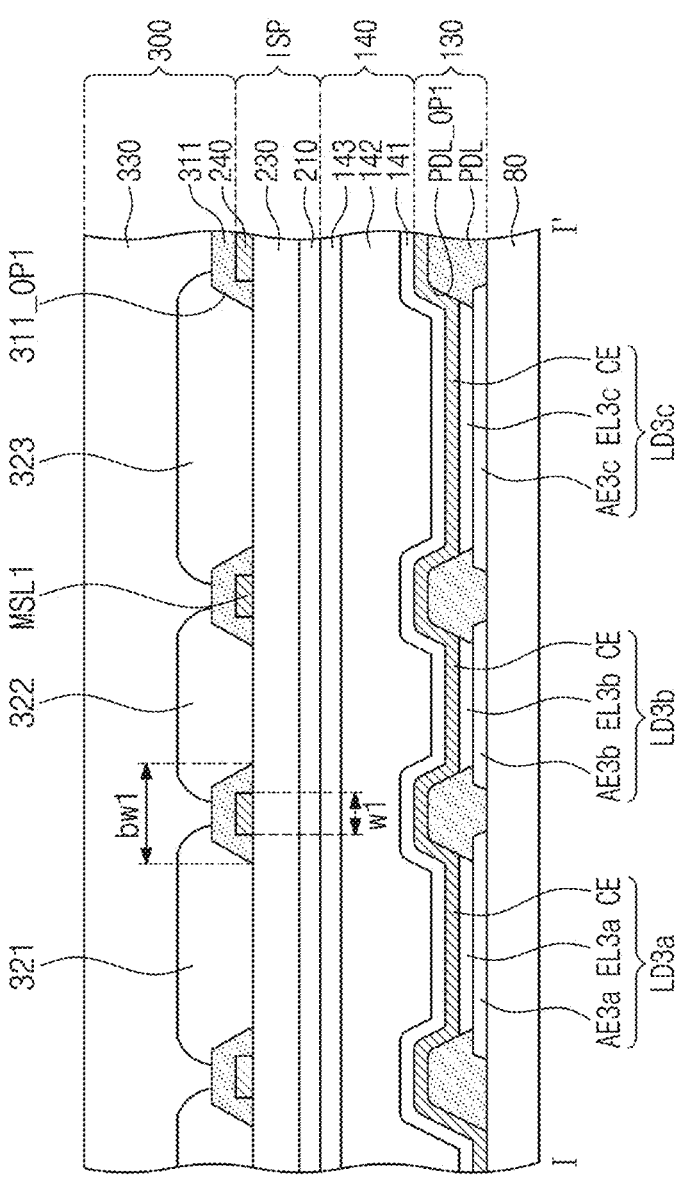
FIG. 9A is a cross-sectional view taken along line I-I' illustrated in FIG. 8B according to an embodiment of the present disclosure.
Figure 9B:
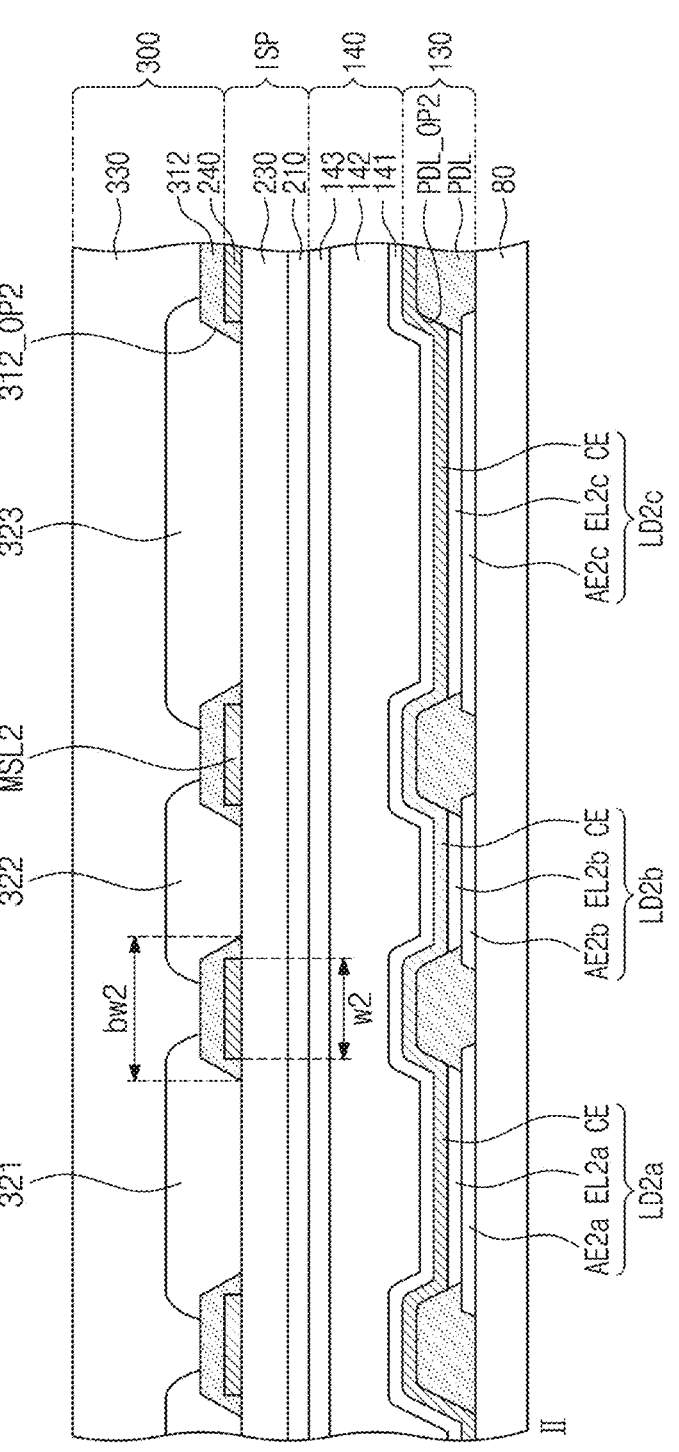
FIG. 9B is a cross-sectional view taken along line II-II' illustrated in FIG. 8B according to an embodiment of the present disclosure.
Figure 9C:
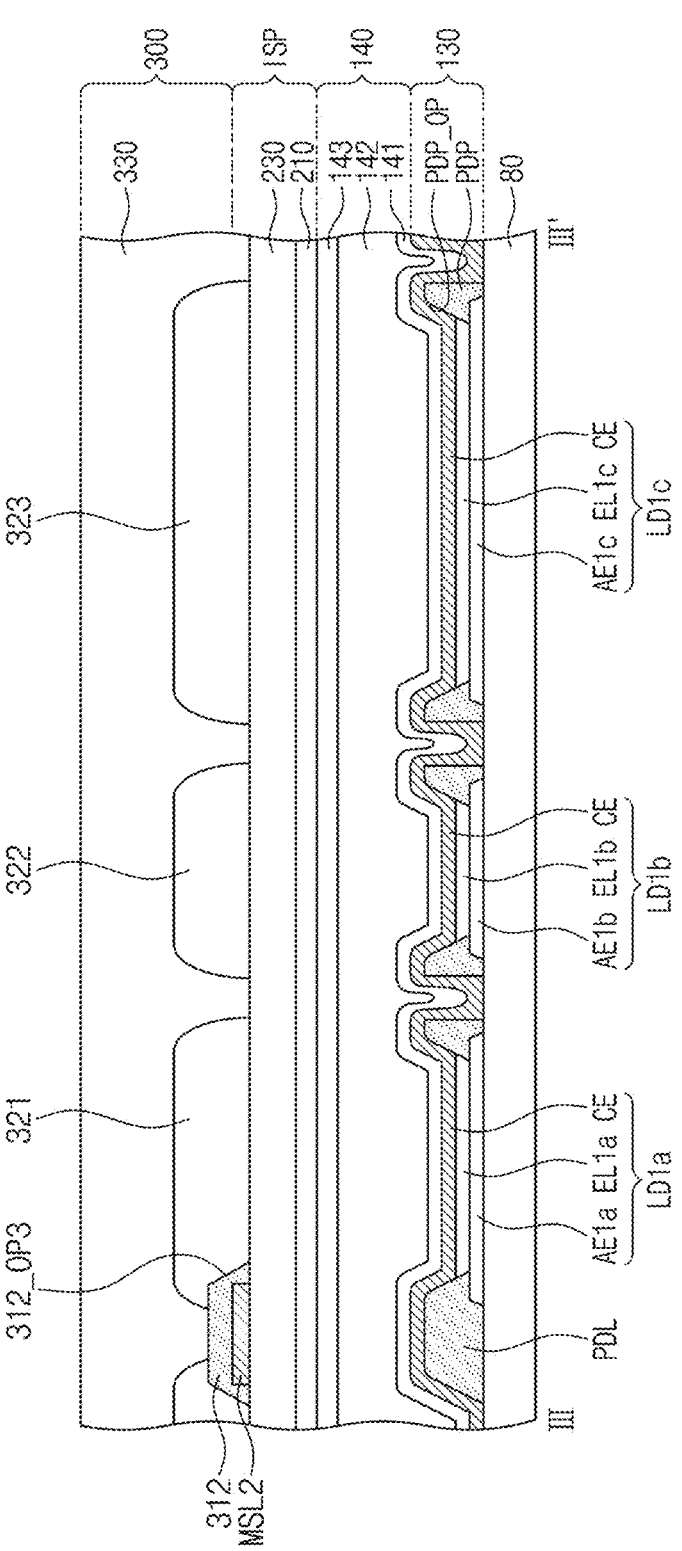
FIG. 9C is a cross-sectional view taken along line III-III' illustrated in FIG. 8B according to an embodiment of the present disclosure.

FIG. 9A is a cross-sectional view taken along line I-I' illustrated in FIG. 8B according to an embodiment of the present disclosure. FIG. 9B is a cross-sectional view taken along line II-II' illustrated in FIG. 8B according to an embodiment of the present disclosure. FIG. 9C is a cross-sectional view taken along line III-III' illustrated in FIG. 8B according to an embodiment of the present disclosure.

Referring to FIGS. 6A, 8B, and 9A, the third light emitting element LD3 may include a third red light emitting element LD3a, a third green light emitting element LD3b, and a third blue light emitting element LD3c. Although the third red light emitting element LD3a, the third green light emitting element LD3b, and the third blue light emitting element LD3c are illustrated as having different sizes, embodiments of the present disclosure are not limited thereto. The sizes of the third red light emitting element LD3a, the third green light emitting element LD3b, and the third blue light emitting element LD3c may be adjusted depending on light emission efficiencies of the third red light emitting element LD3a, the third green light emitting element LD3b, and the third blue light emitting element LD3c.

First pixel openings PDL_OP1 for exposing the third red light emitting element LD3a, the third green light emitting element LD3b, and the third blue light emitting element LD3c may be provided in the pixel defining layer PDL. The sizes of the first pixel openings PDL_OP1 may be set in consideration of the sizes of the corresponding light emitting elements.

The input sensor layer ISP may include the first conductive line MSL1 disposed in the second area ISP_A2. The first conductive line MSL1 may be included in the second conductive layer 240. In the second area ISP_A2, the first conductive line MSL1 may have the first line width w1.

The first dividing layer 311 of the anti-reflection layer 300 may be disposed on the first conductive line MSL1. That is, the first conductive line MSL1 may be covered by the first dividing layer 311. In the second area ISP_A2, the first dividing layer 311 may have a first width bw1. The first width bw1 of the first dividing layer 311 may be greater than the first line width w1 of the first conductive line MSL1. In an embodiment of the present disclosure, the first line width w1 of the first conductive line MSL1 may be smaller than the first width bw1 of the first dividing layer 311 by about 1 μm to about 10 μm.

Referring to FIGS. 6B, 8B, and 9B, the second light emitting element LD2 may include a second red light emitting element LD2a, a second green light emitting element LD2b, and a second blue light emitting element LD2c. Although the second red light emitting element LD2a, the second green light emitting element LD2b, and the second blue light emitting element LD2c are illustrated as having different sizes, embodiments of the present disclosure are not limited thereto. The sizes of the second red light emitting element LD2a, the second green light emitting element LD2b, and the second blue light emitting element LD2c may be adjusted depending on light emission efficiencies of the second red light emitting element LD2a, the second green light emitting element LD2b, and the second blue light emitting element LD2c.

In an embodiment of the present disclosure, the second red light emitting element LD2a may be larger than the third red light emitting element LD3a, the second green light emitting element LD2b may be larger than the third green light emitting element LD3b, and the second blue light emitting element LD2c may be larger than the third blue light emitting element LD3c.

Second pixel openings PDL_OP2 for exposing the second red light emitting element LD2a, the second green light emitting element LD2b, and the second blue light emitting element LD2c may be provided in the pixel defining layer PDL. The sizes of the second pixel openings PDL_OP2 may be set in consideration of the sizes of the corresponding light emitting elements. The sizes of the second pixel openings PDL_OP2 may be larger than the sizes of the first pixel openings PDL_OP1.

The input sensor layer ISP may include the second conductive line MSL2 disposed in the second sub-area ISP_SA2. The second conductive line MSL2 may be included in the second conductive layer 240. In the second sub-area ISP_SA2, the second conductive line MSL2 may have the second line width w2. The second line width w2 of the second conductive line MSL2 may be greater than the first line width w1 of the first conductive line MSL1. In an embodiment of the present disclosure, the second line width w2 of the second conductive line MSL2 may be at least two times greater than the first line width w1 of the first conductive line MSL1. For example, when the first line width w1 of the first conductive line MSL1 is about 4 μm, the second line width w2 of the second conductive line MSL2 may be about 10 μm.

The second dividing layer 312 of the anti-reflection layer 300 may be disposed on the second conductive line MSL2. That is, the second conductive line MSL2 may be covered by the second dividing layer 312. In the second sub-area ISP_SA2, the second dividing layer 312 may have a second width bw2. The second width bw2 of the second dividing layer 312 may be greater than the second line width w2 of the second conductive line MSL2. In an embodiment of the present disclosure, the second line width w2 of the second conductive line MSL2 may be smaller than the second width bw2 of the second dividing layer 312 by about 1 μm to about 10 μm.

Referring to FIGS. 8B and 9C, the first light emitting element LD1 may include a first red light emitting element LD1*a*, a first green light emitting element LD1*b*, and a first blue light emitting element LD1*c*. Although the first red light emitting element LD1*a*, the first green light emitting element LD1*b*, and the first blue light emitting element LD1*c* are illustrated as having different sizes, embodiments of the present disclosure are not limited thereto. The sizes of the first red light emitting element LD1*a*, the first green light emitting element LD1*b*, and the first blue light emitting element LD1*c* may be adjusted depending on light emission efficiencies of the first red light emitting element LD1*a*, the first green light emitting element LD1*b*, and the first blue light emitting element LD1*c*.

In an embodiment of the present disclosure, the first red light emitting element LD1*a* may be larger than the third red light emitting element LD3*a*, the first green light emitting element LD1*b* may be larger than the third green light emitting element LD3*b*, and the first blue light emitting element LD1*c* may be larger than the third blue light emitting element LD3*c*. Furthermore, the first red light emitting element LD1*a* may have a size larger than or equal to that of the second red light emitting element LD2*a*, the first green light emitting element LD1*b* may have a size larger than or equal to that of the second green light emitting element LD2*b*, and the first blue light emitting element LD1*c* may have a size larger than or equal to that of the second blue light emitting element LD2*c*.

Third pixel openings PDP_OP for exposing the first red light emitting element LD1*a*, the first green light emitting element LD1*b*, and the first blue light emitting element LD1*c* may be provided in the pixel defining pattern PDP. The sizes of the third pixel openings PDP_OP may be set in consideration of the sizes of the corresponding light emitting elements. The sizes of the third pixel openings PDP_OP may be larger than the sizes of the first pixel openings PDL_OP1 and may be larger than or equal to the sizes of the second pixel openings PDL_OP2.

In an embodiment, the second conductive line MSL2 is not disposed in the first sub-area ISP_SA1, and the second dividing layer 312 is not disposed in the first sub-area ISP_SA1. The third opening pattern 312_OP3 may be defined in the second dividing layer 312 in a size corresponding to the first sub-area ISP_SA1. That is, in an embodiment, the second conductive line MSL2 and the second dividing layer 312 do not overlap the first sub-area ISP_SA1, and therefore, the light transmittance of the first sub-area ISP_SA1 may be prevented from being lowered by the second conductive line MSL2 and the second dividing layer 312.

The first to third color filters 321, 322, and 323 may be disposed in the first sub-area ISP_SA1. In the first sub-area ISP_SA1, the first to third color filters 321, 322, and 323 may be disposed in consideration of the positions of the first red light emitting element LD1*a*, the first green light emitting element LD1*b*, and the first blue light emitting element LD1*c*.

Figure 10A:
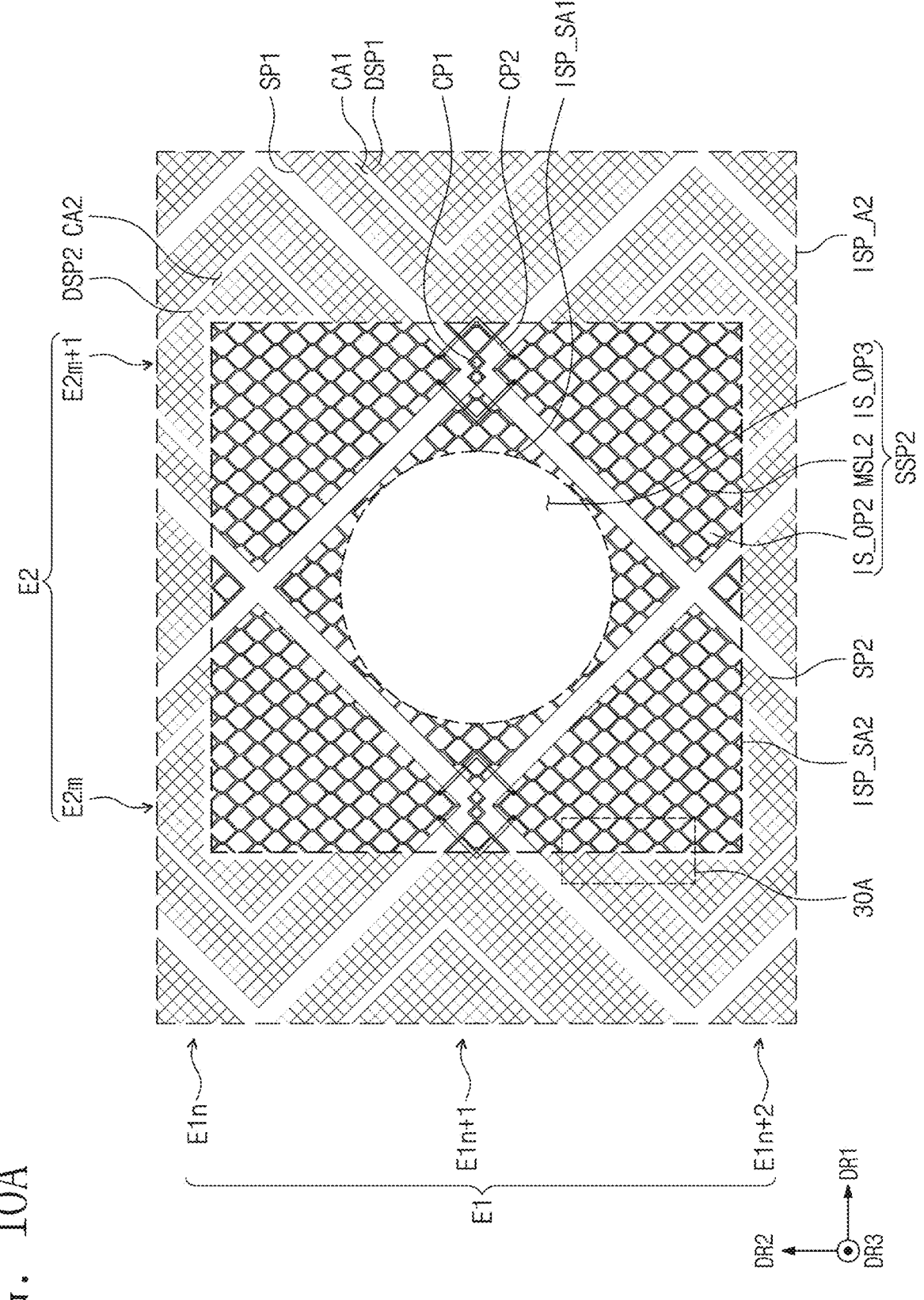
FIG. 10A is an enlarged plan view of a portion of the input sensor layer according to an embodiment of the present disclosure.
Figure 10B:
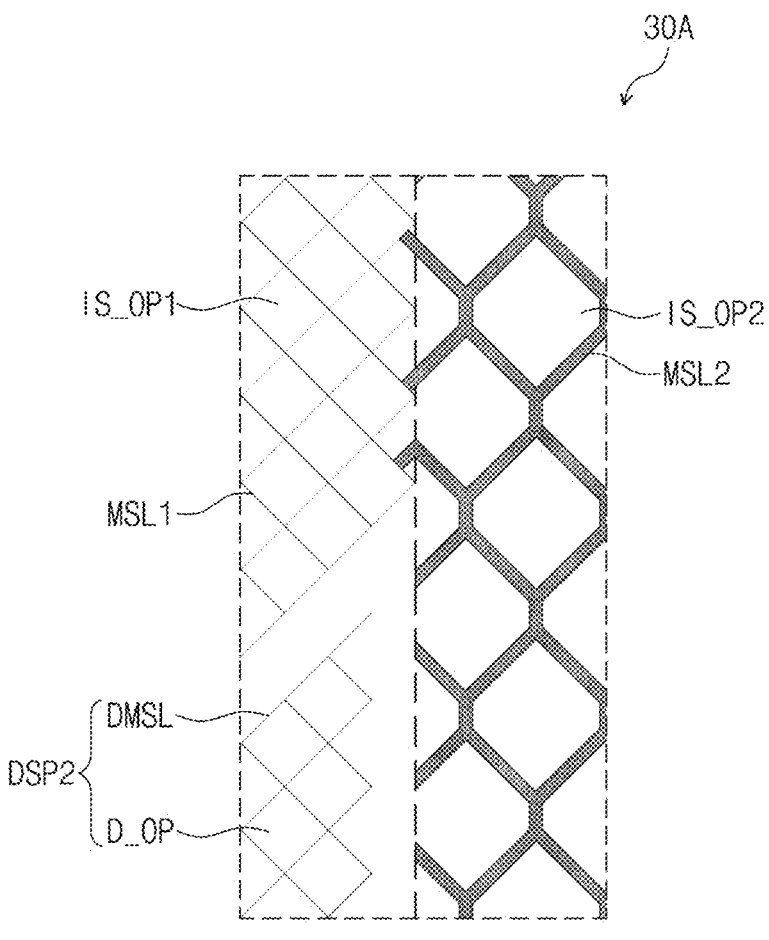
FIG. 10B is an enlarged view of a portion of FIG. 10A according to an embodiment of the present disclosure.
Figure 10C:
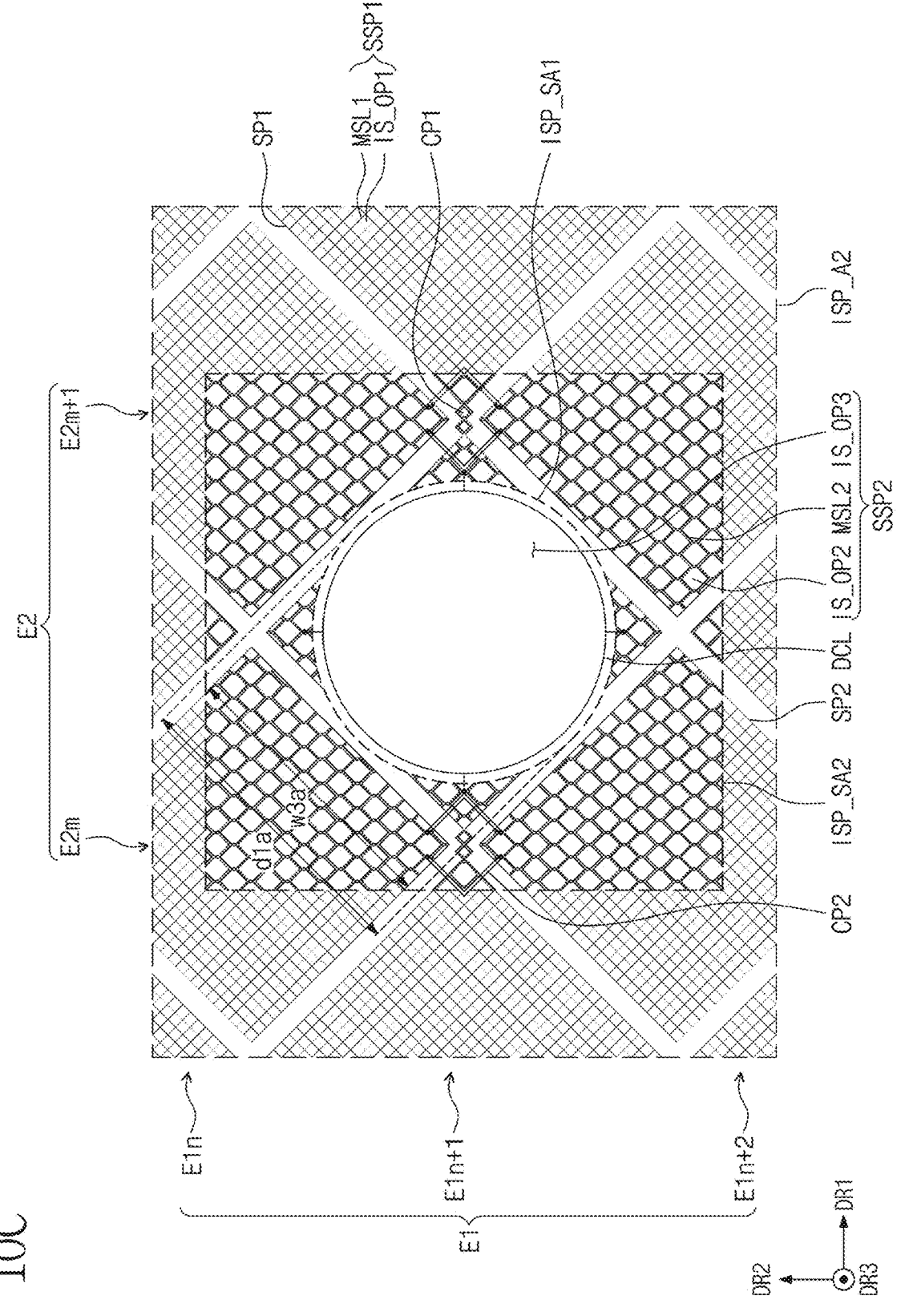
FIG. 10C is an enlarged plan view of a portion of the input sensor layer according to an embodiment of the present disclosure.

FIG. 10A is an enlarged plan view of a portion of the input sensor layer according to an embodiment of the present disclosure. FIG. 10B is an enlarged view of a portion of FIG. 10A according to an embodiment of the present disclosure. FIG. 10C is an enlarged plan view of a portion of the input sensor layer according to an embodiment of the present disclosure. Among components illustrated in FIGS. 10A and 10C, components identical to the components illustrated in FIG. 5B will be assigned with identical reference numerals, and for convenience of explanation, a further specific description thereof will be omitted.

Referring to FIGS. 10A and 10B, the first group of electrodes E1 includes the first sensing parts SP1 spaced apart from each other in the first direction DR1 and the first connecting patterns CP1 connecting the first sensing parts SP1. The second group of electrodes E2 includes the second sensing parts SP2 spaced apart from each other in the second direction DR2 and the second connecting patterns CP2 connecting the second sensing parts SP2.

The first group of electrodes E1 may further include first dummy electrodes DSP1 disposed in the second area ISP_A2, and the second group of electrodes E2 may further include second dummy electrodes DSP2 disposed in the second area ISP_A2. The first dummy electrodes DSP1 are spaced apart from the first sensing parts SP1, and the second dummy electrodes DSP2 are spaced apart from the second sensing parts SP2. The first dummy electrodes DSP1 may be electrically separated from the first sensing parts SP1, and the second dummy electrodes DSP2 may be electrically separated from the second sensing parts SP2.

Each of the first dummy electrodes DSP1 may be surrounded by one first sensing part SP1 on the plane. For example, each of the first sensing parts SP1 may have a rhombic shape, and a first empty space CA1 may be formed in a central area of the first sensing part SP1. The first dummy electrode DSP1 may be disposed in the first empty space CA1 and may be electrically separated from the first sensing part SP1.

Each of the second dummy electrodes DSP2 may be surrounded by one second sensing part SP2 on the plane. For example, each of the second sensing parts SP2 may have a rhombic shape, and a second empty space CA2 may be formed in a central area of the second sensing part SP2. The second dummy electrode DSP2 may be disposed in the second empty space CA2 and may be electrically separated from the second sensing part SP2.

The first and second dummy electrodes DSP1 and DSP2 may have a floating state. Accordingly, the first and second dummy electrodes DSP1 and DSP2 may decrease parasitic capacitance generated between the first and second groups of electrodes E1 and E2 and the electrodes (e.g., the second electrodes CE) included in the light emitting elements LD1 to LD3.

Each of the first and second dummy electrodes DSP1 and DSP2 may include a dummy conductive line DMSL that defines a plurality of dummy openings D_OP.

In an embodiment, the first and second dummy electrodes DSP1 and DSP2 are not disposed in the second sub-area ISP_SA2. The second conductive lines MSL2 in the second sub-area ISP_SA2 may extend toward central areas of the first and second sensing parts SP1 and SP2. In one first sensing part SP1, the second conductive lines MSL2 disposed in the second sub-area ISP_SA2 may be electrically connected to the first conductive lines MSL1 disposed in the second area ISP_A2, but may be electrically separated from the dummy conductive line DMSL of the first dummy electrode DSP1. In one second sensing part SP2, the second conductive lines MSL2 disposed in the second sub-area ISP_SA2 may be electrically connected to the first conductive lines MSL1 disposed in the second area ISP_A2, but may be electrically separated from the dummy conductive line DMSL of the second dummy electrode DSP2. The second conductive lines MSL2 and the first conductive lines MSL1 may have an integral shape within the same sensing part, differing only in the line width.

In the second area ISP_A2, the central areas of the first and second sensing parts SP1 and SP2 may be used as dummy areas where the first or second dummy electrodes DSP1 or DSP2 are disposed. In contrast, in the second sub-area ISP_SA2, the central areas of the first and second sensing parts SP1 and SP2 may be used as electrode areas where the second conductive lines MSL2 are disposed. Accordingly, the area by which the second conductive lines MSL2 are disposed in the second sub-area ISP_SA2 may be increased, and thus, the sensing sensitivity in the second sub-area ISP_SA2 may be increased.

Referring to FIG. 10C, the third opening IS_OP3 may have a size corresponding to the first sub-area ISP_SA1. In this case, in an embodiment, the second conductive lines MSL2 are not disposed in the first sub-area ISP_SA1. That is, in an embodiment, the second conductive lines MSL2 do not overlap the first sub-area ISP_SA1. When the second conductive lines MSL2 do not overlap the first sub-area ISP_SA1, the light transmittance in the first sub-area ISP_SA1 may be increased.

The diameter d1a of the third opening IS_OP3 may be greater than or equal to the width w3a of each of the first and second sensing parts SP1 and SP2. In FIG. 10C, a structure in which the third opening IS_OP3 overlaps one first sensing part SP1 is illustrated. The second conductive lines MSL2 included in the first sensing part SP1 may be spaced apart from each other by the third opening IS_OP3. In this case, the first sensing part SP1 may further include a dummy connecting line DCL for electrically connecting the second conductive lines MSL2 separated from each other.

The dummy connecting line DCL may overlap the first sub-area ISP_SA1. The dummy connecting line DCL may be disposed on the same layer as the second conductive lines MSL2. However, embodiments of the present disclosure are not limited thereto. The dummy connecting line DCL may be disposed on a different layer from the second conductive lines MSL2. For example, when the second conductive lines MSL2 are included in the second conductive layer 240 (refer to FIG. 7B), the dummy connecting line DCL may be included in the first conductive layer 220 (refer to FIG. 7B). The line width of the dummy connecting line DCL may be smaller than the line width of each of the second conductive lines MSL2. For example, the line width of the dummy connecting line DCL may be equal to the line width of each of the first conductive lines MSL1.

Figure 11A:
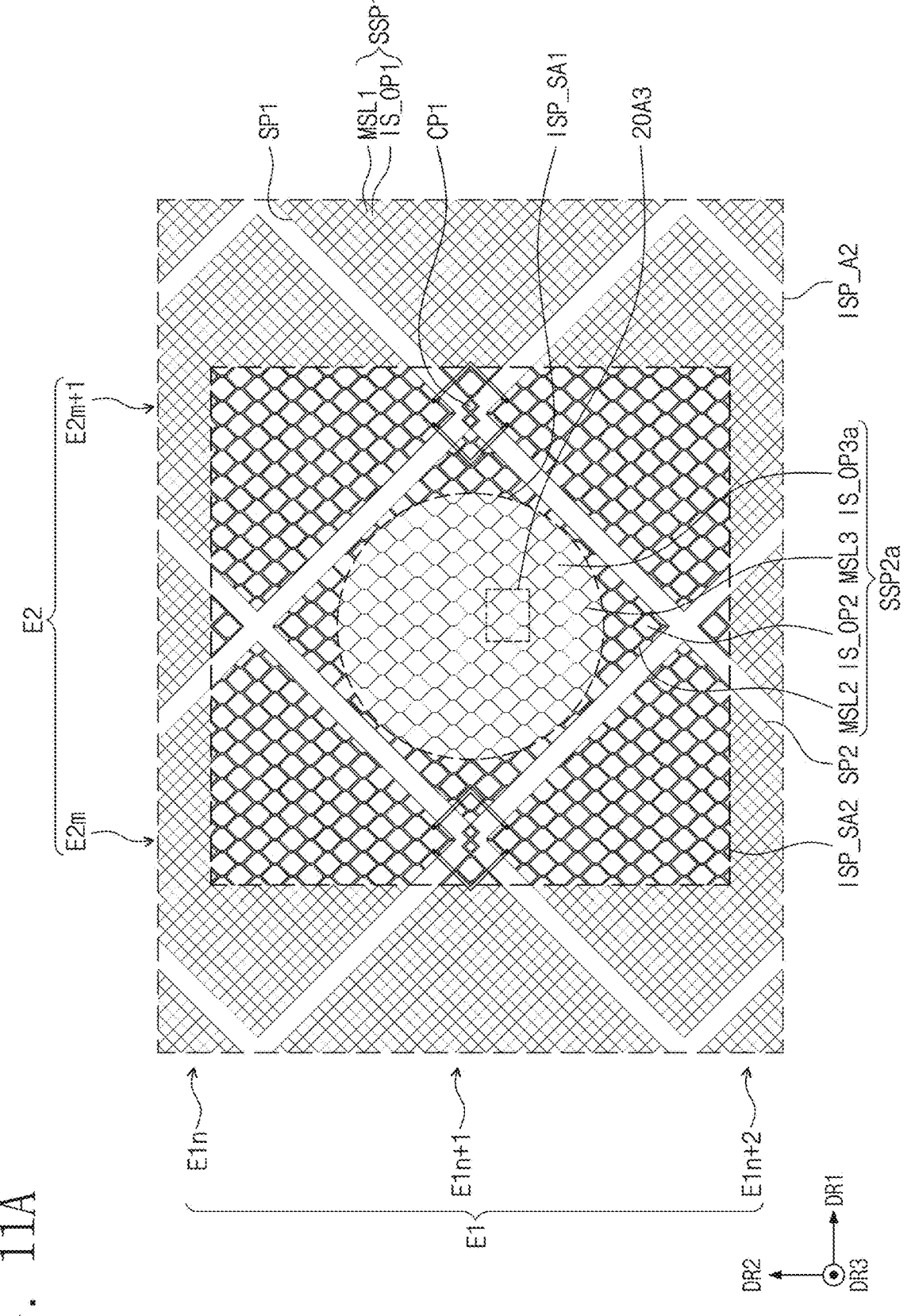
FIG. 11A is an enlarged plan view of a portion of the input sensor layer according to an embodiment of the present disclosure.
Figure 11B:
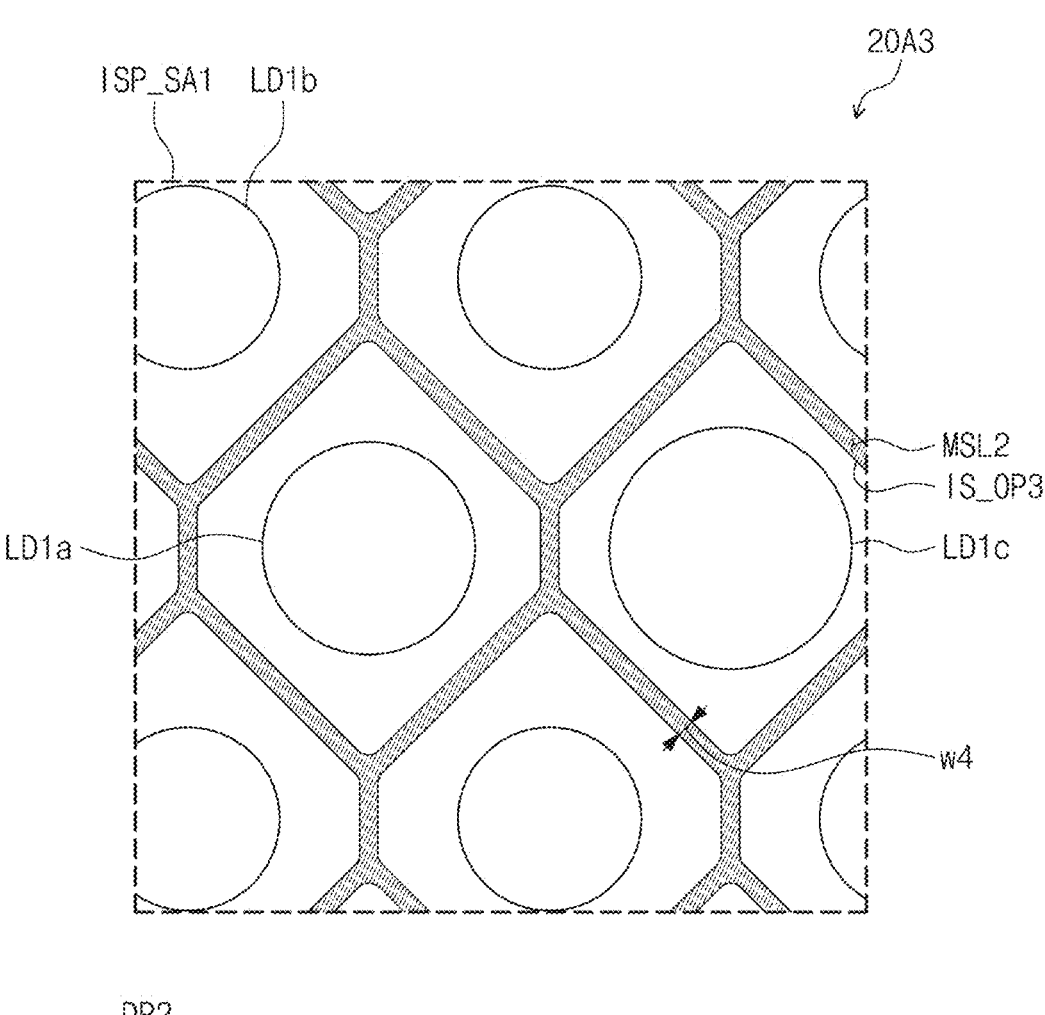
FIG. 11B is an enlarged view of a third portion of FIG. 11A according to an embodiment of the present disclosure.
Figure 11B:
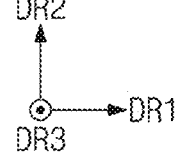
Figure 11C:
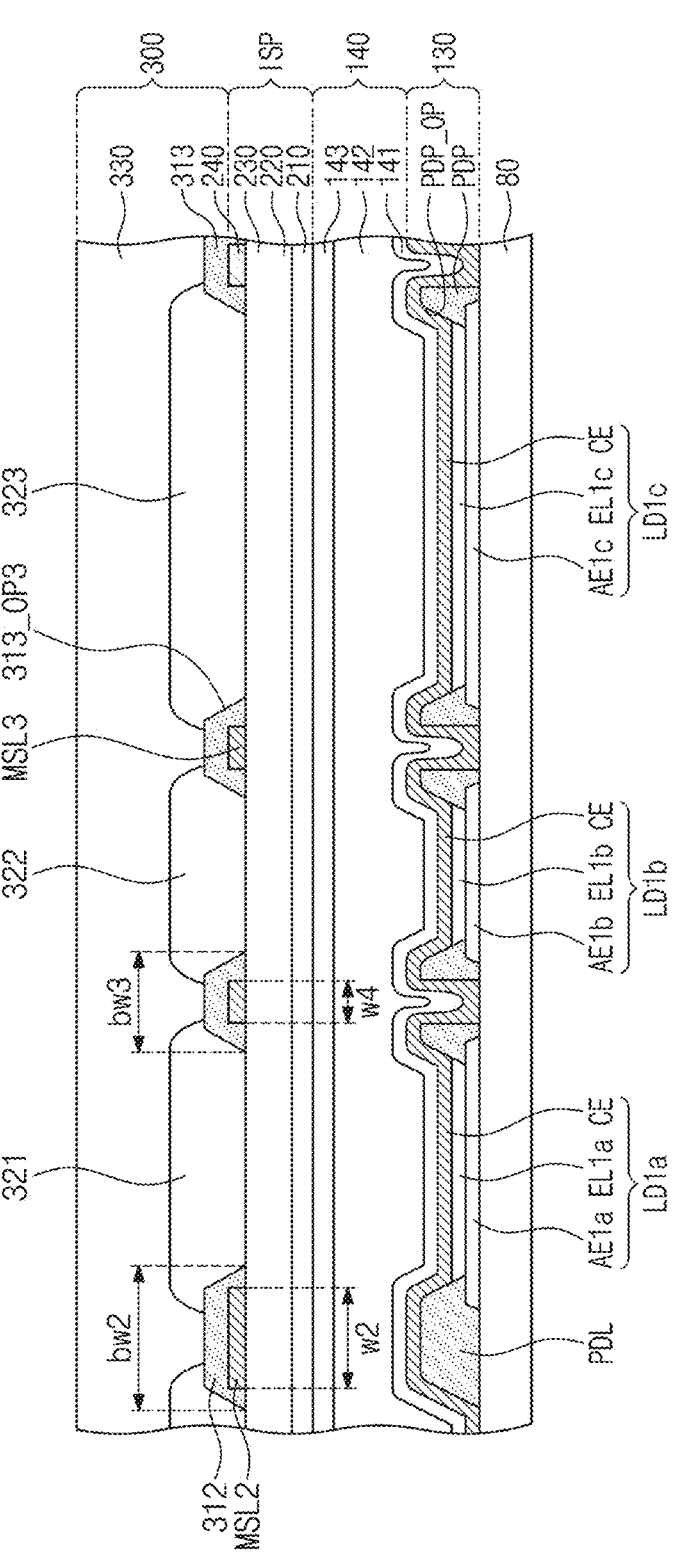
FIG. 11C is a cross-sectional view of a portion illustrated in FIG. 11B according to an embodiment of the present disclosure.

FIG. 11A is an enlarged plan view of a portion of the input sensor layer according to an embodiment of the present disclosure. FIG. 11B is an enlarged view of a third portion of FIG. 11A according to an embodiment of the present disclosure. FIG. 11C is a cross-sectional view of a portion illustrated in FIG. 11B according to an embodiment of the present disclosure. Among components illustrated in FIGS. 11A to 11C, components identical to the components illustrated in FIG. 5B will be assigned with identical reference numerals, and for convenience of explanation, a further description thereof will be omitted.

Referring to FIGS. 11A to 11C, the first group of electrodes E1 includes the first sensing parts SP1 spaced apart from each other in the first direction DR1 and the first connecting patterns CP1 connecting the first sensing parts SP1. The second group of electrodes E2 includes the second sensing parts SP2 spaced apart from each other in the second direction DR2 and the second connecting patterns CP2 connecting the second sensing parts SP2.

Each of the first sensing parts SP1 may have a mesh shape, and each of the second sensing parts SP2 may have a mesh shape. Some of the first sensing parts SP1 may be disposed in the second area ISP_A2, and the other first sensing parts SP1 may be disposed in the first area ISP_A1. Similarly, some of the second sensing parts SP2 may be disposed in the second area ISP_A2, and the other second sensing parts SP2 may be disposed in the first area ISP_A1. Hereinafter, for convenience of description, the first and second sensing parts SP1 and SP2 disposed in the second area ISP_A2 are referred to as the first sensing pattern SSP1, and the first and second sensing parts SP1 and SP2 disposed in the first area ISP_A1 are referred to as the second sensing pattern SSP2a.

The first sensing pattern SSP1 includes the plurality of first openings IS_OP1 overlapping the second area ISP_A2. The second sensing pattern SSP2a includes the plurality of second openings IS_OP2 overlapping the second sub-area ISP_SA2 and a plurality of third openings IS_OP3a overlapping the first sub-area ISP_SA1. In an embodiment of the present disclosure, the second openings IS_OP2 may have a larger size than the first openings IS_OP1. Furthermore, the third openings IS_OP3a may have a size larger than or equal to the size of the second openings IS_OP2. In an embodiment of the present disclosure, the third openings IS_OP3a may be larger than the second openings IS_OP2.

The first sensing pattern SSP2 further includes the first conductive line MSL1 that defines the plurality of first openings IS_OP1. The second sensing pattern SSP2a further includes the second conductive line MSL2 that defines the plurality of second openings IS_OP2 and a third conductive line MSL3 that defines the plurality of third openings IS_OP3a. The line width w2 of the second conductive line MSL2 may be greater than the line width w1 (refer to FIG. 6A) of the first conductive line MSL1. In an embodiment of the present disclosure, the line width w1 of the first conductive line MSL1 may be about 4 μm, and the line width w2 of the second conductive line MSL2 may be about 10 μm. The line width w4 of the third conductive line MSL3 may be smaller than the line width w2 of the second conductive line MSL2. In an embodiment of the present disclosure, the line width w4 of the third conductive line MSL3 may be smaller than or equal to the line width w1 of the first conductive line MSL1.

The plurality of first openings IS_OP1 may have a different shape from the plurality of second openings IS_OP2. In an embodiment of the present disclosure, the plurality of the first openings IS_OP1 may have a quadrilateral shape, and the plurality of second openings IS_OP2 may have a hexagonal shape. However, this is illustrative, and the shapes of the plurality of first openings IS_OP1 and the plurality of second openings IS_OP2 are not particularly limited. Furthermore, the plurality of third openings IS_OP3a may have a shape the same as, or different from, the shape of the plurality of second openings IS_OP2. In an embodiment of the present disclosure, the plurality of third openings IS_OP3a and the plurality of second openings IS_OP2 may each have a hexagonal shape. However, the shapes of the plurality of third openings IS_OP3a and the plurality of second openings IS_OP2 are not particularly limited.

The third conductive line MSL3 may be disposed in the first sub-area ISP_SA1, and thus, the sensing sensitivity in the first sub-area ISP_SA1 may be increased. However, to prevent or reduce deterioration in light transmittance in the first sub-area ISP_SA1 by the third conductive line MSL3, the line width w4 of the third conductive line MSL3 may be set to be smaller than the line width w2 of the second conductive line MSL2.

Referring to FIGS. 11B and 11C, the first light emitting element LD1 may include the first red light emitting element LD1a, the first green light emitting element LD1b, and the first blue light emitting element LD1c. Although the first red light emitting element LD1a, the first green light emitting element LD1b, and the first blue light emitting element LD1c are illustrated as having different sizes, embodiments of the present disclosure are not limited thereto. The sizes of the first red light emitting element LD1a, the first green light emitting element LD1b, and the first blue light emitting element LD1c may be adjusted depending on light emission efficiencies of the first red light emitting element LD1a, the first green light emitting element LD1b, and the first blue light emitting element LD1c.

In an embodiment of the present disclosure, the first red light emitting element LD1a may be larger than the third red light emitting element LD3a, the first green light emitting element LD1b may be larger than the third green light emitting element LD3b, and the first blue light emitting element LD1c may be larger than the third blue light emitting element LD3c. Furthermore, the first red light emitting element LD1a may have a size larger than or equal to that of the second red light emitting element LD2a, the first green light emitting element LD1b may have a size larger than or equal to that of the second green light emitting element LD2b, and the first blue light emitting element LD1c may have a size larger than or equal to that of the second blue light emitting element LD2c.

The third pixel openings PDP_OP for exposing the first red light emitting element LD1a, the first green light emitting element LD1b, and the first blue light emitting element LD1c may be provided in the pixel defining pattern PDP. The sizes of the third pixel openings PDP_OP may be set in consideration of the sizes of the corresponding light emitting elements. The sizes of the third pixel openings PDP_OP may be larger than the sizes of the first pixel openings PDL_OP1 and may be larger than or equal to the sizes of the second pixel openings PDL_OP2.

The third conductive line MSL3 may be disposed in the first sub-area ISP_SA1, and the anti-reflection layer 300 may further include a third dividing layer 313 disposed in the first sub-area ISP_SA1. Third opening patterns 313_OP3 may be defined in the third dividing layer 313 in a size corresponding to the third pixel openings PDP_OP. The third opening patterns 313_OP3 may have a larger size than the second opening patterns 312_OP2 (refer to FIG. 9B).

The third dividing layer 313 may be disposed on the third conductive line MSL3. That is, the third conductive line MSL3 may be covered by the third dividing layer 313. In the first sub-area ISP_SA1, the third dividing layer 313 may have a third width bw3. The third width bw3 of the third dividing layer 313 may be greater than the third line width w4 of the third conductive line MSL3. In an embodiment of the present disclosure, the third line width w4 of the third conductive line MSL3 may be smaller than the third width bw3 of the third dividing layer 313 by about 1 µm to about 10 µm.

The third width bw3 of the third dividing layer 313 may be set to be smaller than the second width bw2 of the second dividing layer 312, and thus, deterioration in light transmittance in the first sub-area ISP_SA1 by the third dividing layer 313 may be prevented or reduced.

In FIGS. 11A to 11C, a structure in which the third conductive line MSL3 is formed of the same material as the second conductive line MSL2 and is disposed on the same layer as the second conductive line MSL2. However, embodiments of the present disclosure are not limited thereto. The third conductive line MSL3 may be formed of a different material from the second conductive line MSL2. For example, the third conductive line MSL3 may be formed of a transparent conductive material. When the third conductive line MSL3 is formed of a transparent conductive material, the third dividing layer 313 may be removed from the first sub-area ISP_SA1.

As the third conductive line MSL3 is formed of a transparent conductive material and the third dividing layer 313 is removed, the light transmittance in the first sub-area ISP_SA1 may be increased, and high sensing sensitivity may be secured.

According to embodiments of the present disclosure, the input sensor layer is divided into the first and second areas. The first conductive line of the input sensor layer is disposed in the second area, and the second conductive line of the input sensor layer is not disposed in the first sub-area of the first area and is disposed in the second sub-area of the first area. As the second conductive line is not disposed in the first sub-area as described above, the light transmittance of the first sub-area may be increased.

Here, the second conductive line may have a greater line width than the first conductive line. Accordingly, the sensing sensitivity lowered in the first sub-area may be supplemented (or compensated for) in the second sub-area.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display device, comprising:
a display panel comprising a display area and a peripheral area adjacent to the display area, wherein the display area comprises a first area corresponding to an electro-optical module and through which an optical signal passes and a second area adjacent to the first area and by which the optical signal is blocked; and
a user input sensor layer disposed on the display panel, wherein the user input sensor layer comprises:
a first sensing pattern overlapping the second area, wherein the first sensing pattern has a mesh shape defined by first conductive lines and comprises a plurality of first openings defined by the first conductive lines; and
a second sensing pattern overlapping the first area, wherein the second sensing pattern has a mesh shape defined by second conductive lines and comprises a plurality of second openings defined by the second conductive lines,
wherein a line width of the second conductive lines is greater than a line width of the first conductive lines,
wherein a shape of each of the plurality of second openings is different from a shape of each of the plurality of first openings.

2. The display device of claim 1, wherein the first area comprises a first sub-area having a first light transmittance and a second sub-area having a second light transmittance lower than the first light transmittance, and wherein the second conductive lines overlap the second sub-area and do not overlap the first sub-area.

3. The display device of claim 2, wherein the second sensing pattern further comprises a third conductive line overlapping the first sub-area.

4. The display device of claim 3, wherein a line width of the third conductive line is smaller than the line width of the second conductive line.

5. The display device of claim 2, wherein the display panel further comprises:

a plurality of first pixels disposed in the first sub-area;

a plurality of second pixels disposed in the second sub-area; and a plurality of third pixels disposed in the second area, wherein each of the first pixels comprises a first light emitting element and a first pixel circuit configured to drive the first light emitting element, wherein each of the second pixels comprises a second light emitting element and a second pixel circuit configured to drive the second light emitting element, wherein each of the third pixels comprises a third light emitting element and a third pixel circuit configured to drive the third light emitting element, and wherein the first pixel circuit is disposed in the second sub-area.

6. The display device of claim 5, wherein each of the first and second light emitting elements has a larger size than the third light emitting element when comparing the first to third light emitting devices that output the same color light.

7. The display device of claim 5, wherein the first light emitting element has a same size as the second light emitting element when comparing the first and second light emitting devices that output the same color light.

8. The display device of claim 5, further comprising:

an antireflection layer disposed on the user input sensor layer, wherein the anti-reflection layer comprises:

a first dividing layer disposed in the second area, the first dividing layer having a first width;

a second dividing layer disposed in the second sub-area, the second dividing layer having a second width greater than the first width; and a plurality of color filters disposed in positions corresponding to the first to third light emitting elements in the first and second areas.

9. The display device of claim 8, wherein a first conductive line of the first conductive lines overlaps the first dividing layer, wherein a second conductive line of the second conductive lines overlaps the second dividing layer, wherein the line width of the first conductive line is smaller than the first width of the first dividing layer, and wherein the line width of the second conductive line is smaller than the second width of the second dividing layer.

10. The display device of claim 8, wherein the first dividing layer comprises a first opening pattern having a size corresponding to the third light emitting element, wherein the second dividing layer comprises a second opening pattern having a size corresponding to the second light emitting element, and wherein the second opening pattern has a larger size than the first opening pattern.

11. The display device of claim 10, wherein the second dividing layer further comprises a third opening pattern having a size corresponding to the first sub-area.

12. The display device of claim 10, wherein the anti-reflection layer further comprises a third dividing layer disposed in the first sub-area, the third dividing layer having a third width smaller than the second width, and wherein the third dividing layer comprises a third opening pattern having a larger size than the first light emitting element.

13. The display device of claim 12, wherein the third opening pattern is larger than the second opening pattern.

14. The display device of claim 1, wherein the user input sensor layer further comprises a dummy electrode electrically separated from the first and second conductive lines.

15. An electronic device, comprising:

a display panel comprising a display area and a peripheral area adjacent to the display area, wherein the display area comprises a first area through which an optical signal passes and a second area adjacent to the first area and by which the optical signal is blocked;

a user input sensor layer disposed over the display panel; and an electro-optical module disposed under the display panel and configured to receive the optical signal passing through the first area, wherein the input sensor layer comprises:

a first sensing pattern overlapping the second area, wherein the first sensing pattern has a mesh shape defined by first conductive lines and comprises a plurality of first openings defined by the first conductive lines; and a second sensing pattern overlapping the first area, wherein the second sensing pattern has a mesh shape defined by second conductive lines and comprises a plurality of second openings defined by the second conductive lines, wherein a line width of each of the second conductive lines is greater than a line width of each of the first conductive lines, wherein a shape of each of the plurality of second openings is different from a shape of each of the plurality of first openings.

16. The electronic device of claim 15, wherein the first area comprises a first sub-area having a first light transmittance and a second sub-area having a second light transmittance lower than the first light transmittance, and wherein the second conductive lines overlap the second sub-area and do not overlap the first sub-area.

17. The electronic device of claim 16, wherein the second sensing pattern further comprises a third conductive line overlapping the first sub-area.

18. The electronic device of claim 17, wherein a line width of the third conductive line is smaller than the line width of each of the second conductive lines.

19. The electronic device of claim 16, wherein the display panel further comprises:

a plurality of first pixels disposed in the first sub-area;

a plurality of second pixels disposed in the second sub-area; and a plurality of third pixels disposed in the second area, wherein each of the first pixels comprises a first light emitting element and a first pixel circuit configured to drive the first light emitting element, wherein each of the second pixels comprises a second light emitting element and a second pixel circuit configured to drive the second light emitting element, wherein each of the third pixels comprises a third light emitting element and a third pixel circuit configured to drive the third light emitting element, and wherein the first pixel circuit is disposed in the second sub-area.

20. The electronic device of claim 19, further comprising:

an anti-reflection layer disposed over the user input sensor layer, wherein the anti-reflection layer comprises:

a first dividing layer disposed in the second area, the first dividing layer having a first width;

a second dividing layer disposed in the second sub-area, the second dividing layer having a second width greater than the first width; and a plurality of color filters disposed in positions corresponding to the first to third light emitting elements in the first and second areas.

21. The electronic device of claim 20, wherein a first conductive line of the first conductive lines overlaps the first dividing layer, wherein a second conductive line of the second conductive lines overlaps the second dividing layer, wherein the line width of the first conductive line is smaller than the first width of the first dividing layer, and wherein the line width of the second conductive line is smaller than the second width of the second dividing layer.

22. The electronic device of claim 20, wherein the first dividing layer comprises a first opening pattern having a size corresponding to the third light emitting element, wherein the second dividing layer comprises a second opening pattern having a size corresponding to the second light emitting element, and wherein the second opening pattern has a larger size than the first opening pattern.

23. The electronic device of claim 15, wherein the shape of each of the plurality of first openings is quadrilateral and the shape of each of the plurality of second openings is hexagonal.

\* \* \* \* \*